United States Patent
Yoshizawa et al.

(10) Patent No.: US 9,500,732 B2
(45) Date of Patent: Nov. 22, 2016

(54) MAGNETIC RESONANCE IMAGING DEVICE AND ANGIOGRAPHY USING SAME

(75) Inventors: Nobuyuki Yoshizawa, Tokyo (JP); Shinji Kurokawa, Tokyo (JP)

(73) Assignee: HITACHI, LTD., Tokyo (JP)

( * ) Notice: Subject to any disclaimer, the term of this patent is extended or adjusted under 35 U.S.C. 154(b) by 585 days.

(21) Appl. No.: 13/981,567

(22) PCT Filed: Jan. 26, 2012

(86) PCT No.: PCT/JP2012/051653
§ 371 (c)(1),
(2), (4) Date: Jul. 24, 2013

(87) PCT Pub. No.: WO2012/102338
PCT Pub. Date: Aug. 2, 2012

(65) Prior Publication Data
US 2013/0307537 A1    Nov. 21, 2013

(30) Foreign Application Priority Data
Jan. 28, 2011    (JP) .................................. 2011-016968

(51) Int. Cl.
*G01R 33/54*    (2006.01)
*G01R 33/561*    (2006.01)
(Continued)

(52) U.S. Cl.
CPC ............ *G01R 33/54* (2013.01); *G01R 33/4826* (2013.01); *G01R 33/5617* (2013.01); *G01R 33/5635* (2013.01); *G01R 33/4822* (2013.01); *G01R 33/543* (2013.01); *G01R 33/5673* (2013.01)

(58) Field of Classification Search
CPC .............. G01R 33/5617; G01R 33/54; G01R 33/4822; G01R 33/543
See application file for complete search history.

(56) References Cited

U.S. PATENT DOCUMENTS

| 5,779,636 A | 7/1998 | Kanazawa |
| 2002/0032376 A1* | 3/2002 | Miyazaki ............ A61B 5/0263 600/410 |

(Continued)

FOREIGN PATENT DOCUMENTS

| JP | 8-173397 | 7/1996 |
| JP | 9-508 | 1/1997 |

(Continued)

OTHER PUBLICATIONS

Machine Translation of JP 9-508 A obtained on Mar. 17, 2016.*
(Continued)

*Primary Examiner* — Gregory H Curran
(74) *Attorney, Agent, or Firm* — Cooper & Dunham LLP

(57) ABSTRACT

In the non-contrast 3D angiography, degradation of image quality caused by change of the cardiac cycle and degradation of image quality depending on the blood flow direction are prevented to provide an MRA image of favorable image quality, which is useful for diagnosis. A pulse sequence of the multi echo type for performing sampling of three-dimensional k-space data in a circular or elliptical shape is employed as the imaging sequence, and gated imaging based on body motion information is performed. Heart rate is monitored during the imaging, delay time DT from a gating signal and data acquisition time AT determined according to the cardiac cycle are calculated, and according to these imaging parameters, sampling trajectory and echo train number of the circular sampling are controlled.

19 Claims, 23 Drawing Sheets

(51) Int. Cl.
*G01R 33/563* (2006.01)
*G01R 33/48* (2006.01)
*G01R 33/567* (2006.01)

(56) References Cited

U.S. PATENT DOCUMENTS

| | | |
|---|---|---|
| 2008/0081987 A1 | 4/2008 | Miyazaki |
| 2008/0161678 A1 | 7/2008 | Miyazaki et al. |
| 2011/0152669 A1* | 6/2011 | Kassai .................. A61B 5/055 600/413 |

FOREIGN PATENT DOCUMENTS

| | | |
|---|---|---|
| JP | 4090619 | 1/2000 |
| JP | 4309632 | 4/2004 |
| JP | 2007-313303 | 12/2007 |
| JP | 2008-86747 | 4/2008 |
| JP | 2010-82436 | 4/2010 |
| JP | 2010-240468 | 10/2010 |
| JP | 2010-246596 | 11/2010 |

OTHER PUBLICATIONS

International Preliminary Report on Patentability corresponding to International application No. PCT/JP2012/051653.

International Search Report in PCT/JP2012/051653.

Roes, Stijntje D. et al., "Correction for Heart Rate Variability During 3D Whole Heart MR Coronary Angiography", Journal of Magnetic Resonance Imaging, vol. 27, 1046-1053, 2008.

Busse, Reed F. et al., "Effects of Refocusing Flip Angle Modulation and View Ordering in 3D Fast Spin Echo", Magnetic Resonance in Medicine, vol. 60, 640-649, 2008.

* cited by examiner

| circular(eliptical) sampling ||
|---|---|
| k1 | k2 |
| -128 | 0 |
| -128 | 1 |
| -127 | 0 |
| -126 | 0 |
| -126 | 1 |
| -125 | 0 |
| . | . |
| . | . |
| . | . |
| 126 | 0 |
| 127 | 1 |
| 127 | 0 |
| -128 | 1 |
| -127 | 1 |
| -127 | 2 |
| -126 | 0 |
| -125 | 1 |
| -125 | 0 |
| . | . |
| . | . |
| . | . |

Fig. 10

MAGNETIC RESONANCE IMAGING DEVICE AND ANGIOGRAPHY USING SAME

TECHNICAL FIELD

The present invention relates to a magnetic resonance imaging (MRI) apparatus, especially an MRI apparatus for obtaining a three-dimensional angiogram of a subject without using any contrast medium.

BACKGROUND ART

As imaging techniques of MRI, there are techniques for obtaining three-dimensional angiograms without using any contrast medium (Patent documents 1 and 2). In such non-contrast angiography, it is desirable to carry out cardiac gated imaging in order to enhance artery or vein depiction ability, and in this case, echo signal acquisition is triggered with signals obtained on the basis of pulsation of the heart (for example, R waves), but started with a certain delay time. Specifically, echo signals are obtained only in the diastolic or systolic phase of the heart. However, the diastolic and systolic phases of the heart do not necessarily occur with constant cycles. Therefore, when a predetermined number of echo signals are obtained, image quality may be degraded, or there may be waste time not used for the measurement after acquisition of echo signals. Accordingly, such imaging methods as mentioned above suffer from such problems as degradation of image quality and prolongation of the measurement time for measuring a predetermined number of echo signals required for reconstructing a three-dimensional image.

Further, a technique for imaging with changing delay time for imaging of the diastolic phase on the real time basis has been proposed in Non-patent document 1. According to this technique, it is possible to prevent degradation of image quality due to the change of the delay time, but it cannot eliminate the aforementioned problems caused by the change between the diastolic and systolic phases.

Moreover, in the conventional non-contrast 3D imaging, a multi echo type sequence is generally used, and a step of collecting echo signals, in which one of phase encoding and slice encoding is fixed and another is changed, is repeated while changing the one. Therefore, influence of the T2 decay necessarily appears in either one of the phase encoding direction or slice encoding direction. Imaging with such data including influence of the T2 decay results in blurred MRA image in the phase encoding direction or the slice encoding direction, which may inhibit correct diagnosis.

In addition, although it is not a technique for angiography, as a technique for three-dimensional imaging, an imaging technique using sampling of three-dimensional k-space data circularly or elliptically, not rectangularly, is disclosed in Non-patent document 2. Such rectangular sampling is a technique of performing sampling along a trajectory parallel to one axis of the coordinates of the k-space, and it is called orthogonal system sampling.

PRIOR ART REFERENCES

Patent Documents

Patent document 1: Japanese Patent No. 4090619
Patent document 2: Japanese Patent No. 4309632

Non-Patent Documents

Non-patent document 1: JMRI, 27:1046-1053 (2008), "Correction for Heart Rate Variability During 3D Whole Heart MR Coronary Angiography"

Non-patent document 2: Magnetic Resonance in Medicine, 60:640-649 (2008), "Effects of Refocusing Flip Angle Modulation and View Ordering in 3D Fast Spin Echo"

SUMMARY OF THE INVENTION

Object to be Achieved by the Invention

An object of the present invention is to solve the problems of the conventional non-contrast 3D angiography mentioned above, i.e., the problems of degradation of the image quality and prolongation of the measurement time resulting from change of the diastolic phase and systolic phases of the heart, the problem of degradation of image quality of imaged vessels for a certain axis direction of gradient magnetic field, the problem of difference of image quality depending on the direction of blood flow, and so forth, and provides an MRI apparatus that can provide an angiogram of good image quality irrespective of the change of the diastolic and systolic phases of the heart or the direction of blood flow.

Means for Achieving the Object

In order to achieve the aforementioned object, the MRI apparatus of the present invention employs an imaging sequence for performing sampling in a circular or elliptic contour in a plane perpendicular to the readout direction of the three-dimensional k-space data (henceforth referred to as circular sampling) as the imaging sequence, performs gated imaging utilizing body motion information, and controls sampling trajectory and sampling number of the circular sampling, and echo train number, if the sequence is a multi echo type sequence, according to the imaging parameters including delay time and signal acquisition time. The circular (elliptical) sampling of the present invention is a kind of non-orthogonal system sampling in contrast to the orthogonal system sampling.

Namely, the MRI apparatus of the present invention comprises an imaging part comprising a static magnetic field generation part, a gradient magnetic field generation part, a radio frequency magnetic field generation part, and a magnetic resonance signal reception part, and a measurement controller for controlling operations of the imaging part according to an imaging sequence, the imaging sequence includes an angiography sequence for performing circular or elliptical sampling of a plane perpendicular to the readout direction of the three-dimensional k-space, and the measurement controller controls the imaging sequence by using a gating signal based on body motion information of a subject, and controls the circular or elliptical sampling according to delay time from the gating signal and signal acquisition time.

The measurement controller controls, for example, sampling trajectory and/or sampling number of the circular or elliptical sampling.

According to one embodiment of the MRI apparatus of the present invention, the measurement controller comprises a calculating means for calculating the delay time and the signal acquisition time, the calculating means updates the delay time and the signal acquisition time on the basis of body motion information of a subject under imaging, and controls the circular or elliptical sampling according to the updated delay time and signal acquisition time.

In another embodiment of the MRI apparatus of the present invention, the apparatus comprises a parameter setting part for setting parameters of the imaging sequence, and the measurement controller controls sampling trajectory of the circular or elliptical sampling according to the parameters set by the parameter setting part, so as to minimize change of signal intensity of data adjacent in the sampling direction.

Further, the angiography method of the present invention is an angiography method comprising executing an angiography sequence for performing circular or elliptical sampling of a plane perpendicular to the readout direction of the three-dimensional k-space, and at the time of the execution of the sequence, controlling the circular or elliptical sampling by using a gating signal based on body motion information of a subject according to delay time from the gating signal and signal acquisition time.

Effect of the Invention

According to the present invention, by employing the circular sampling for angiography, and changing trajectory and number of the sampling according to imaging parameters for gated imaging, blurring of angiogram generated in an encoding direction-dependent manner can be eliminated, and an angiogram can be obtained without degradation of image quality by managing change of conditions accompanying the gated imaging, specifically, change of imaging parameters or change of heart rate.

BRIEF DESCRIPTION OF THE DRAWINGS

FIG. 10 is a table for controlling order of the data acquisition in the circular sampling.

FIG. 15 shows change of echo train number due to shortening of data acquisition time AT.

MODES FOR CARRYING OUT THE INVENTION

Figure 1:
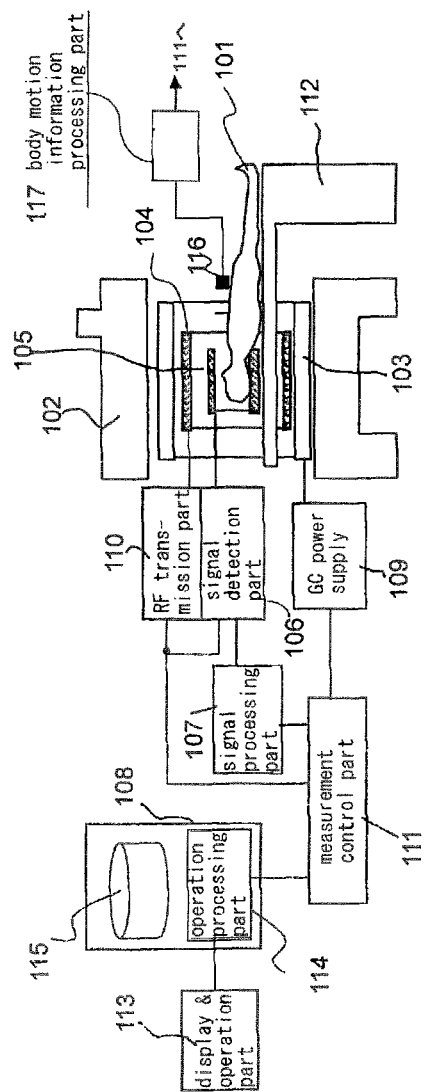
FIG. 1 is a block diagram showing the outline of the whole MRI apparatus of the present invention.

Hereafter, embodiments of the MRI apparatus of the present invention will be explained. In all the drawings for explaining the embodiments of the present invention, the same numerals are used for parts of the same functions, and repetition of explanation thereof will be omitted.

First, outline of the whole MRI apparatus of the present invention will be explained with reference to FIG. 1. This MRI apparatus is configured to obtain a tomographic image of a subject 101 using the NMR phenomenon, and comprises a static magnetic field generation magnet 102, a gradient magnetic field coil 103, a gradient magnetic field power supply 109, a transmission RF coil 104, an RF transmission part 110, a reception RF coil 105, a signal detection part 106, a signal processing part 107, a measurement controller 111, a main controller 108, a display and operation part 113, and a bed 112 for carrying the subject 101 and entering the subject 101 into the inside of the static magnetic field generation magnet 102.

The static magnetic field generation magnet 102 consists of a static magnetic field generation source of permanent magnet type, resistive type or superconduction type, and generates a substantially uniform static magnetic field along the direction perpendicular to the body axis direction of the subject 101 in the case of a vertical magnetic field type apparatus, or along the body axis direction in the case of a horizontal magnetic field type apparatus.

The gradient magnetic field coil 103 comprises coils wound along the three axial directions of X, Y and Z of the real space coordinate system (stationary coordinate system) of the MRI apparatus, and the gradient magnetic field coils are connected to the gradient magnetic field power supply 109 which drives each gradient coil, and supplied with an electric current. The gradient magnetic field power supply 109 for each coil is driven according to a command from the measurement controller 111 described later to supply an electric current to each gradient magnetic field coil. Gradient magnetic fields Gx, Gy and Gz are thereby generated along the three axial directions of X, Y and Z. Positional information is encoded in echo signals by the gradient magnetic fields.

The transmission RE coil 104 is a coil for irradiating an RF pulse on the subject 101, and it is connected to the RF transmission part 110, and supplied with a radio frequency pulse current, Nuclear magnetic resonance is thereby induced in nuclear spins of atoms constituting living tissues of the subject 101. Specifically, the RF transmission part 110 is driven with a command from the measurement controller 111 described later, an outputted high frequency pulse is amplitude-modulated, amplified, and then supplied to the transmission RF coil 104 disposed adjacently to the subject 1, and thereby an RF pulse is irradiated on the subject 1.

The reception RF coil 105 is a coil for receiving NMR signals (echo signals) emitted from nuclear spins of atoms constituting living tissues of the subject 101 by the NMR phenomenon, and it is connected to the signal detection part 106, and sends the received echo signals to the signal detection part 106. The signal detection part 106 performs detection processing of the echo signals received by the reception RE coil 105. Specifically, echo signals as a response of the subject 101 induced by the RF pulse irradiated from the RF transmission coil 104 are received by the reception RF coil 105 disposed adjacently to the subject 101, and the signal detection part 106 amplifies the received echo signals according to a command from the measurement controller 111 described later, divides them into two perpendicular groups of signals by rectangular phase detection, performs sampling of the signals of each group in a predetermined number of times (for example, 128, 256, 512 etc.), converts sampled signals of each group into digital quantities by A/D conversion, and sends them to the signal processing part 107 described later. Therefore, the echo signals are obtained as time series digital data consisting of sampling data of a predetermined number (henceforth referred to as echo data).

The signal processing part 107 performs various kinds of processing with the echo data, and sends the processed echo data to the measurement controller 111.

The measurement controller 111 is a control part for transmitting various commands for data collection required for reconstruction of a homographic image of the subject 101 mainly to the gradient magnetic field power supply 109, the RF transmission part 110, and the signal detection part 106, and thereby controlling them. Specifically, the measurement controller 111 operates under a control of the main controller 108 described later, and controls the gradient magnetic field power supply 109, the RF transmission part 110, and the signal detection part 106 on the basis of a predetermined pulse sequence to repeatedly execute application of an RF pulse and a gradient magnetic field pulse to the subject 101 and detection of echo signals from the subject 101, and collect echo data required for reconstruction of an image for an imaging region of the subject 101.

The main controller 108 controls the measurement controller 111, controls various kinds of data processing, display and storage of processing results, and so forth, and comprises an operation processing part 114 including CPU and a memory inside, and a storage part 115 consisting of an optical disc, a magnetic disk or the like. When the main controller 108 controls the measurement controller 111 to make it execute collection of echo data, and when the echo data are inputted from the measurement controller 111, the operation processing part 114 stores the echo data in corresponding regions of the k-space in the memory on the basis of the encoding information encoded in the echo data. A group of echo data stored in the regions of the memory corresponding to the k-space are also called k-space data. Then, the operation processing part 114 performs processings with the k-space data, such as signal processing and image reconstruction based on the Fourier transform, and displays an image of the subject 101 as a result of the processings on the display and operation part 113 described later and records it in the storage part 115.

The display and operation part 113 comprises a display part for displaying the reconstructed image of the subject 101, and an operation part for inputting various kinds of control information for the MRI apparatus and control information for processings executed by the aforementioned main controller 108, such as trackball, mouse, or keyboard. This operation part is disposed adjacently to the display part, and an operator interactively controls various processings of the MRI apparatus through the operation part with seeing the display part.

This MRI apparatus further is equipped with a body motion information detection part for detecting body motion information of the subject. This body motion information detection part comprises a sensor part 116 for being attached to the subject 101 and detecting body motion information of the subject, and a body motion information processing part 117 for processing signals sent from the sensor part 116 and sending the processed body motion information to the measurement controller 111. When the body motion information detection part is for detecting electrocardiogram (electrocardiac waveform) of the subject, the sensor part 116 is an electrode for detecting electrocardiogram, and the body motion information processing part 117 processes analog signals sent from the electrode. The measurement controller 111 controls gated imaging in which imaging is performed by executing a pulse sequence with synchronizing the imaging with the body motion information of the subject detected by the body motion information detection part.

In FIG. 1, the RF transmission coil 104 and the gradient coil 103 of the transmission side are disposed in the static magnetic field space of the static magnetic field generation magnet 102, into which the subject 101 is entered, so as to face the subject 101 in the case of the vertical magnetic field type apparatus, or so as to surround the subject 101 in the case of the horizontal magnetic field type apparatus. The reception RF coil 105 on the reception side is also disposed so as to face or surround the subject 101.

Hereafter, the imaging method using the MRI apparatus of the aforementioned configuration will be explained. The MRI apparatus of the present invention has a function for performing angiography without using any contrast medium, and uses a pulse sequence and process flow for angiography.

First Embodiment

The MRI apparatus of this embodiment comprises an imaging part comprising a static magnetic field generation part, a gradient magnetic field generation part, a radio frequency magnetic field generation part, and a magnetic resonance signal reception part, and a measurement controller for controlling operations of the imaging part according to an imaging sequence, the imaging sequence includes an angiography sequence for performing circular or elliptical sampling of a plane perpendicular to the readout direction of the three-dimensional k-space, and the measurement controller controls operation of the imaging sequence by using a gating signal based on body motion information of a subject, and controls the circular or elliptical sampling according to delay time from the gating signal and signal acquisition time.

The measurement controller controls, for example, sampling trajectory and/or sampling number of the circular or elliptical sampling according to the delay time from the gating signal and signal acquisition time.

That is, this embodiment is a basic embodiment serving as a basis of the other embodiments described later, and is characterized by employing a pulse sequence for performing circular or elliptical sampling of the k-space at the time of cardiac gated angiography.

Figure 2:
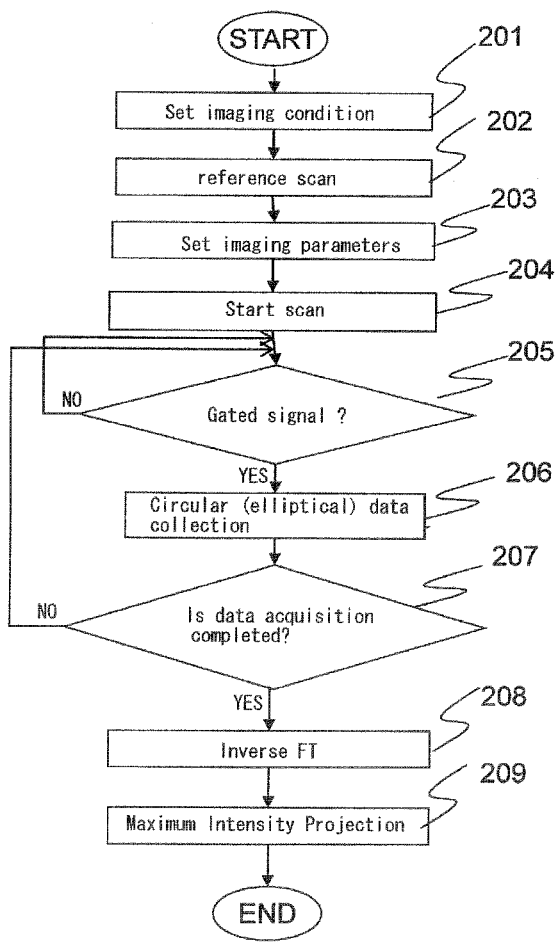
FIG. 2 is a flowchart showing a process flow of angiography according to the first embodiment.

The process flow of the angiography of this embodiment is shown in FIG. 2. The whole process flow of this processing and individual processings of the respective steps are stored as programs beforehand in the storage part 115 such as a magnetic disc, and implemented by CPU by reading the programs into the memory and executing them as required. The respective steps will be explained below. Since the MRI apparatus of the present invention obtains a non-contrast MRA image, the process does not include a step of administering a contrast medium to a subject.

In Step 201, an operator sets imaging conditions of the imaging sequence (imaging region, FOV, readout direction, number of matrices of image, etc.) through the display and operation part 113. The imaging sequence is a multi echo type pulse sequence for angiography described later, and imaging parameters such as echo train number (ETL), echo interval (IET), and effective echo time (effective TE) are also set. The readout direction is preferably made to substantially conform to one of the directions concerning the body of the subject, H-F (Head-Foot), R-L (Right-Left), and A-P (Anterior-Posterior) directions. Further, the readout direction is desirably made to conform to running direction of blood vessel. For example, when it is desired to obtain a non-contrast MRA image of the lower extremity, the running directions of blood vessels in the lower extremity are mainly the H-F direction, and therefore it is desirable to make the readout direction agree with the H-F direction.

When blood vessels are running in a plurality of directions, imaging may be repeated with readout directions conforming to the running directions, and the obtained images may be synthesized. For example, at the bifurcation of the subclavian artery, blood vessels are running in both the H-F and R-L directions. Therefore, a favorable image of the subclavian artery can be obtained by performing imaging with the readout directions conforming to the H-F and R-L directions respectively, and synthesizing two of the obtained images.

Further, the operator determines which one of an arteriovenous image (diastolic phase image) or a venous image (systolic phase image) should be obtained as the MRA image. On the basis of this determination, the procedure of the image reconstruction operation in the steps described later is set.

In Step 202, the measurement controller 111 performs reference scan for the imaging region set in Step 201. Echo data or images measured by the reference scan are used for determining imaging parameter values suitable for obtaining a desired non-contrast MRA image using the imaging sequence in the steps described later.

Figure 3:
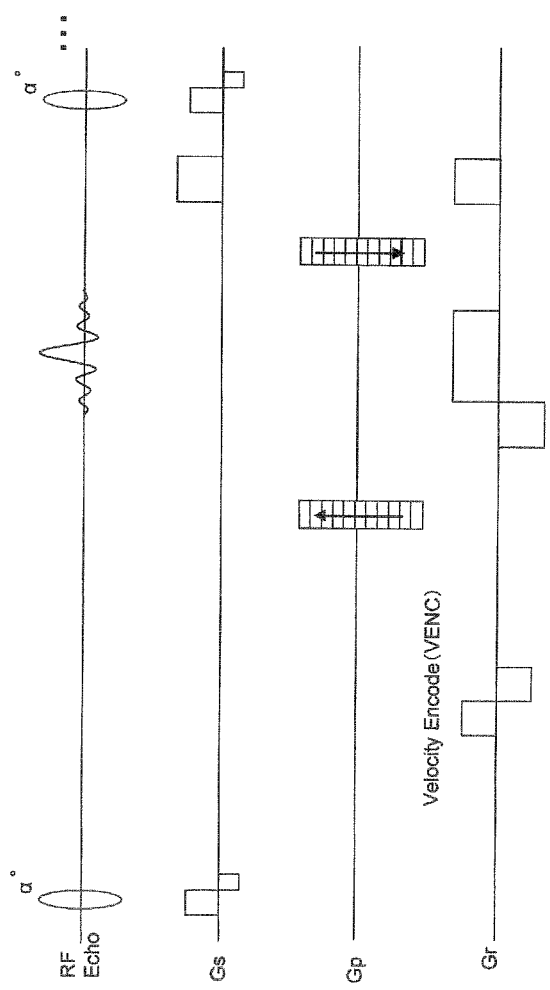
FIG. 3 shows an example of pulse sequence used for reference scanning in the angiography according to the first embodiment.

The pulse sequence used for the reference scan may be such a pulse sequence based on a known PC method using a velocity encoding (VENC) pulse as shown in FIG. 3, or a pulse sequence similar to the imaging sequence. Further, in addition to the aforementioned imaging, cine imaging of high resolution may also be performed, if needed.

Figure 4:
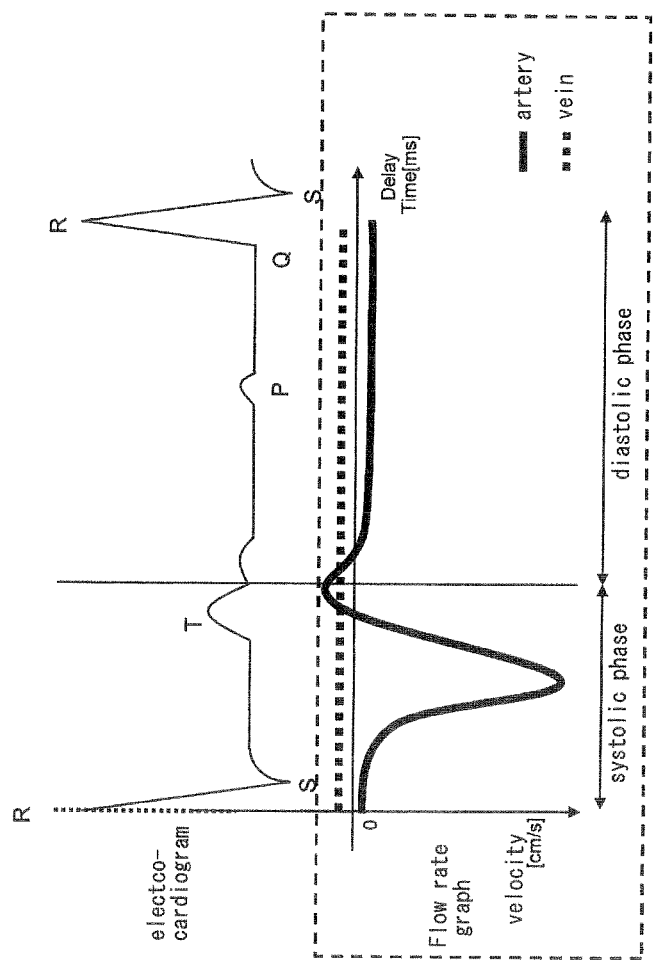
FIG. 4 is a drawing for explaining information concerning cardiac cycle obtained from the reference scanning.

In Step 203, the operation processing part 114 determines imaging parameter values suitable for acquisition of a desired non-contrast MRA image (delay times DT for the systolic and diastolic phases, data acquisition times AT, blood flow velocities) on the basis of the data measured by the reference scan in Step 202 (echo data or image data). Specifically, such a flow rate graph as shown in FIG. 4 (part enclosed with the broken line) can be obtained by the reference scan based on the PC method etc., the systolic or diastolic phase and flow velocities of in artery and vein can be determined from such a flow rate graph. This makes it possible to set desired delay time DT and the following data acquisition time AT for each of the systolic and diastolic phases. The data acquisition time AT can be calculated in accordance with the equation: AT=[ETL]×[IET] using the echo train number ETL and the echo interval IET set in Step 201. When data acquisition time AT set in Step 201 is unduly long with respect to the systolic or diastolic phase determined from the flow rate graph, ETL and IET are appropriately changed. When cine imaging of high resolution is performed, the delay time DT for the diastolic phase can also be determined from a cine image, but it is necessary to perform adjustment suitable for the blood vessel as the object of the imaging. For example, in the case of gated imaging of the lower extremity, the delay time DT is prolonged in consideration of delay from that of the heart.

The operation processing part 114 determines a specific imaging sequence on the basis of the imaging conditions set in Step 201 and the imaging parameter values determined in Step 203.

In Step 204, the measurement controller 111 starts gated imaging (main imaging) by using the specific imaging sequence set in Step 203 so that the imaging is gated with an electrocardiogram detected from the subject. For this imaging, the measurement controller 111 sets the delay time from an R wave on the basis of the MRA image type set in Step 201 and the delay time (DT) determined in Step 203. Specifically, when a venous image is desired, the delay time (DT) from the R wave in the electrocardiogram is set to the systolic phase, and when an arteriovenous image is desired, the delay time (DT) from the F wave in the electrocardiogram is set so to the diastolic phase. Further, in order to obtain a long repetition time (TR) of the imaging sequence, the measurement controller 111 set the repetition time TR to be twice or more of heartbeat intervals.

Figure 5:
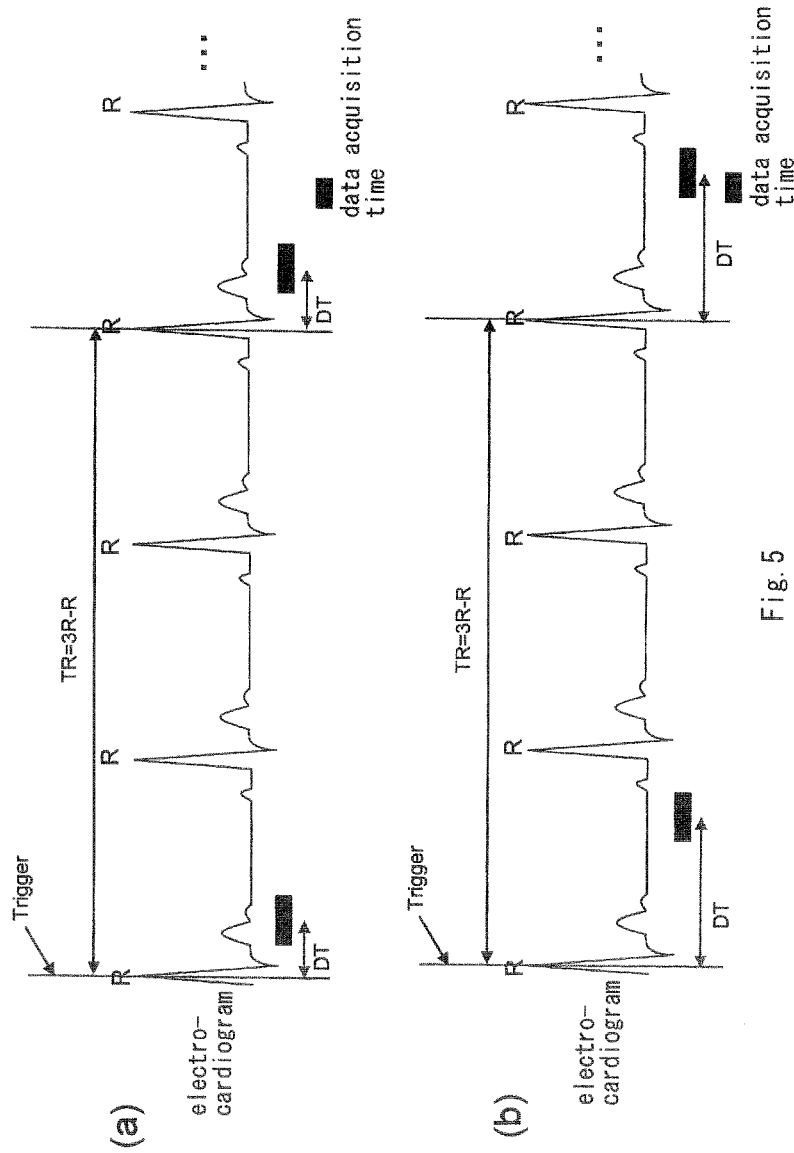
FIG. 5 includes drawings for explaining delay times and data acquisition time for the systolic and diastolic phases.

FIG. 5 includes drawings for explaining gated imaging gated with an electrocardiogram, which show a case where the repetition time (TR) is equalized to be three times of heartbeat intervals (3R-R) as an example of TR set to be twice or more times of heartbeat intervals (R-R). The imaging sequence is executed during a period indicated with a black rectangle (data collection period AT) shown in the drawings. FIG. 5, (*a*) shows an example where the delay time (DT) is set to the systolic phase to obtain a venous image, and FIG. 5, (*b*) shows an example where the delay time (DT) is set to the diastolic phase so as to obtain an arteriovenous image.

As the imaging sequence, a pulse sequence for performing circular or elliptical sampling of the k-space is executed.

Figure 6:
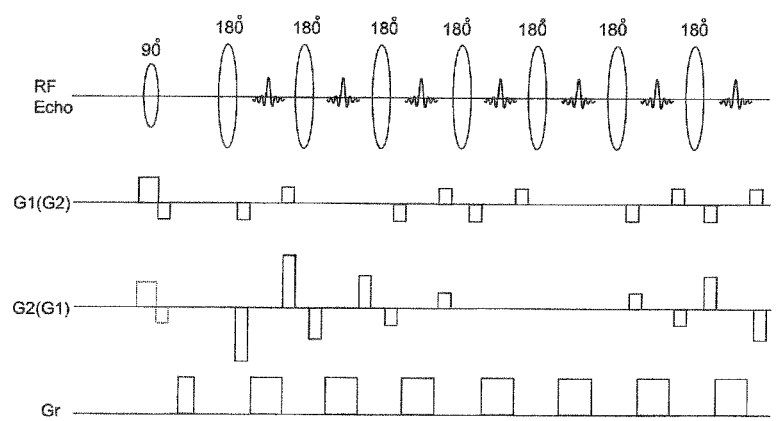
FIG. 6 shows an example of pulse sequence used for main imaging in the angiography according to the first embodiment.

Hereafter, the pulse sequence employed in this embodiment will be explained. FIG. 6 shows an example of the pulse sequence used in the present invention, and shows a 3D pulse sequence according to the fast spin echo (FSE) method. In brief, longitudinal magnetization is first excited by an excitation pulse, then inversion pulses for reversing the longitudinal magnetization are repeatedly applied, and echo signals are measured between the Inversion pulses. In the drawing, a 90° pulse of a flip angle of 90° is shown as the excitation pulse, but the flip angle is not limited to 90°. Further, gradient magnetic fields for encoding the echo signals are applied before and after the echo signal measurement. In a usual 3D pulse sequence, such encoding gradient magnetic fields are applied so that a repetition loop (inner loop) in which encoding amount for one of the slice encoding direction and the phase encoding direction (for example, slice encoding direction) is fixed, and encoding amount for the other (for example, phase encoding direction) is changed is repeated with changing encoding amount for the one of the encoding directions (slice encoding direction). However, in the pulse sequence for the circular (elliptical) sampling, the slice encoding direction and the phase encoding direction are not distinguished, and therefore the slice encoding direction and the phase encoding direction are not distinguished also in the k-space. Instead, sampling of echo signal is repeatedly performed along a circular (elliptical) trajectory with simultaneously changing encoding gradient magnetic fields for two directions (G1, G2). As the two directions, directions perpendicular to the readout direction (Gr) are chosen.

Figure 7:
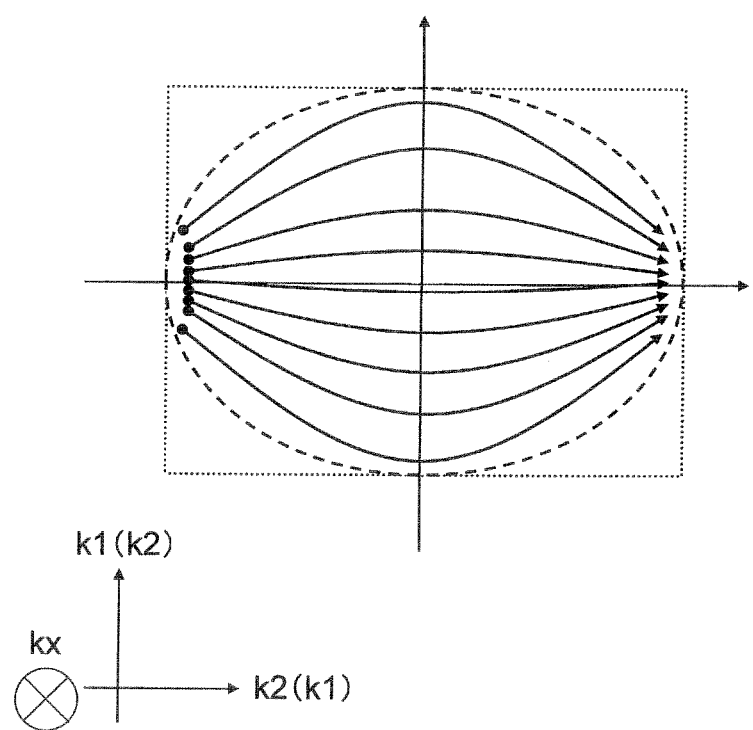
FIG. 7 shows an example of circular sampling employed in the first embodiment.

Therefore, whereas a usual 3D pulse sequence is for performing rectangular sampling, data in a circle or ellipse inscribed in the k-space (ky-kz plane) are collected with the pulse sequence of FIG. 6 (henceforth referred to as circular sampling). FIG. 7 shows an example of the circular sampling. In FIG. 7, the arrows in the circular region indicate data collection directions, i.e., sampling trajectories, and the black circles indicate starting positions of the sampling. In the circular sampling, conventional distinction of the phase encoding direction and the slice encoding direction is not used at all, and therefore the k-space coordinate is represented with k1 and k2, instead of the conventional indications of ky and kz.

With the circular sampling, direction dependency of image quality is eliminated for a plane perpendicular to the readout direction, and therefore the problem of the conventional 3D-MRA that the influence of the T2 decay appears in a certain direction is eliminated. In addition, although not shown in the pulse sequence of FIG. 6, by applying a dephasing or rephasing pulse for two directions other than the readout direction, depiction ability for blood vessels running in a direction other than the readout direction can be improved.

Figure 8:
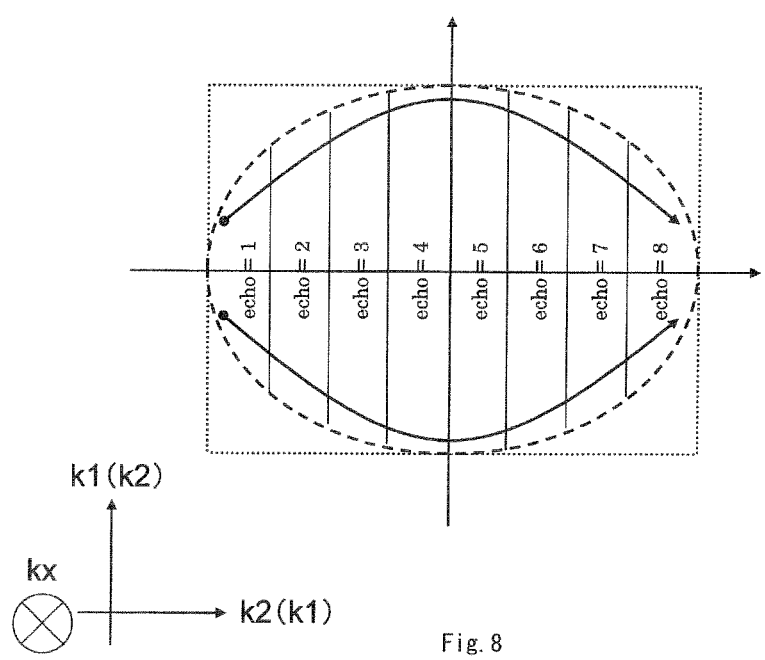
FIG. 8 is a drawing for explaining division of the k-space according to the circular sampling.
Figure 9:
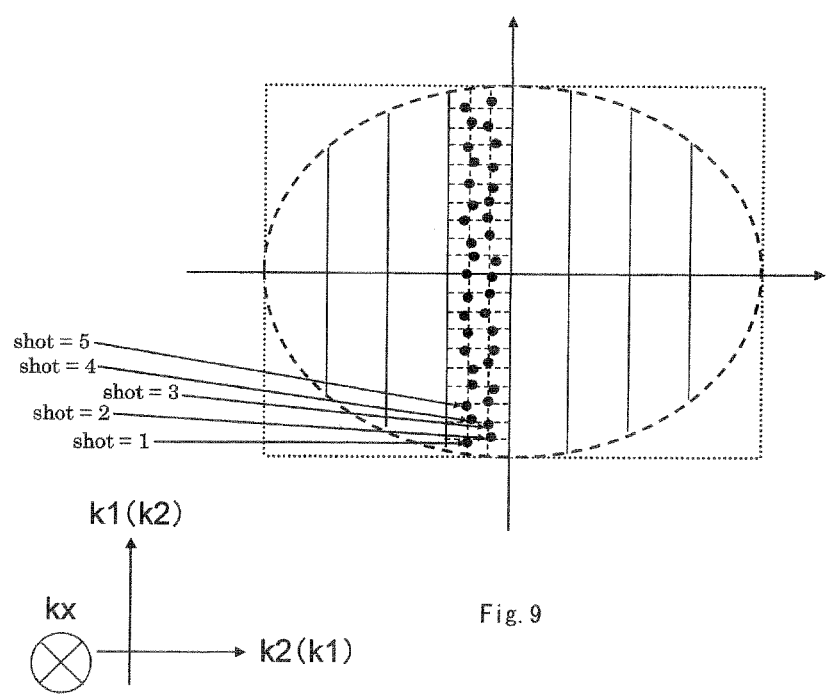
FIG. 9 is a drawing for explaining order of data acquisition in the regions show in FIG. 8.

The algorithm for changing the gradient magnetic fields of two directions for performing the circular sampling will be explained with reference to FIGS. 8 to 10. First, as shown in FIG. 8, the k-space is divided into a plurality of regions according to the number of echoes (echo train number, also called echo factor) to be sampled after one time of irradiation of excitation pulse (one shot). The echo train number is set in Step 201 together with the echo interval of the pulse sequence (IET, application interval of inversion pulses) etc. For simplicity of the explanation, FIG. 8 shows an example where the echo train number is 8, and the circle or ellipse inscribed in the k-space is divided into 8 regions ("echo=1" to "echo=8"). The number of shot is defined as follows: [Number of shot]=[Total number of sampling]/[Echo train number].

Then, for each region, it is determined to which shot of echo train data of lattice points (grids) of the k-space belong. FIG. 9 shows a process of assigning shot numbers to the data belonging to the region assigned to the fourth echo (region of echo=4 shown in FIG. 8). In this process, by virtually changing the positions of the points arranged at the grids at random, all the points can be ordered for each of the k1 direction and the k2 direction. The order of the data acquisition determined as described above is recorded on such a table as shown in FIG. 10 (memory) beforehand, and when the execution of the pulse sequence is started, the encoding gradient magnetic fields G1 and G2 are controlled according to the order recorded on the table.

The explanation returns to the process flow shown in FIG. 2 again. When the gated imaging (main imaging) is started in Step 204, the circular scan mentioned above is performed in Step 205 and Step 206 in a cardiac gated manner. Specifically, data collection is started with a trigger of body motion information (for example, R wave in electrocardiogram) sent to the measurement controller 111 from the body motion information processing part 117, and performed according to the delay time DT set in Step 203 to collect echoes in a predetermined echo train number. In this data collection, the encoding gradient magnetic fields G1 and G2 are controlled according to the order recorded on the table to collect echo data of one shot. The data collection is repeated in every determined repetition time (TR), 3R-R in this example, to eventually collect all the data for the part surrounded by the circle of the k-space shown in FIG. 9.

In Step 207, the measurement controller 111 determines whether measurement of echo data in an amount based on the imaging conditions set in Step 201, i.e., an amount required for the image reconstruction, has been completed, and if the answer is "no", the process returns to Step 205 to continue the circular sampling. If the collection is completed (answer is yes), the process moves to Step 208. The judgment for whether the data acquisition is completed (Step 207) can be performed by judging whether the data collection has been performed for a number of times corresponding to the scheduled number of times of repetition determined at the time of setting the parameters.

In Step 208, the operation processing part 114 performs inverse Fourier transform of the three-dimensional k-space data to reconstruct a three-dimensional image. Then, according to the image type set in Step 201, the operation processing part 114 performs various operations with venous image (systolic phase image) and arteriovenous image (diastolic phase image). For example, if acquisition of an arterial image is set in Step 201, a difference operation is performed between the systolic phase image and the diastolic phase image, and a three-dimensional image obtained as a result of the difference operation is used as a three-dimensional arterial image.

In Step 209, the operation processing part 114 creates a projection image for a desired direction as a final non-contrast MRA image by using the three-dimensional image data obtained in Step 208. As the processing for creating a projection image, for example, the known MIP (Maximum Intensity Projection) method or the volume rendering method can be used.

According to this embodiment, the influence of the T2 decay can be distributed in two directions other than the readout direction in the cardiac gated angiography by employing the circular (elliptical) sampling. Therefore, degradation of image quality depending on encoding direction can be eliminated, and an angiogram can be obtained with less blurring. Further, since the sampling number can be reduced compared with the case where the sampling is performed in a rectangular shape, imaging time can be shortened.

Figure 11:
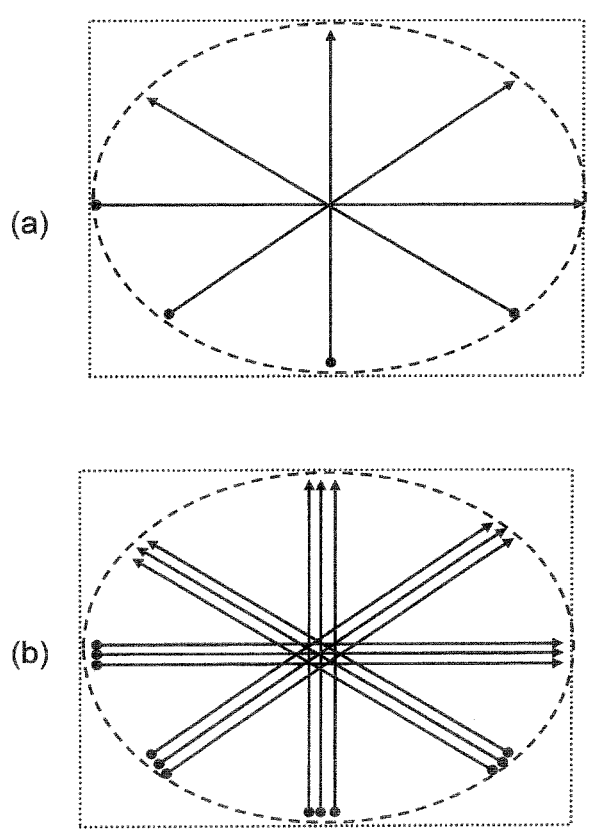
FIGS. 11, (a) and (b) show other examples of the circular sampling.

In the above explanation, there was explained an example where sampling is performed for a circular region of the k-space along circular arcs as an example of the circular sampling. However, as other examples of the circular sampling, as shown in FIGS. 11, (a) and (b), sampling of a circular region can be performed along the radiuses passing the origin of the k-space as the center. In the drawings, the arrows indicate sampling trajectories, and the black circles indicate starting points of the sampling. FIG. 11, (a) shows a case where the sampling angle is changed for every shot, and FIG. 11, (b) shows a case where the sampling angle is changed for every two or more shots performed with the same angle (blade). The former is also called radial scan, and the latter is also called hybrid radial scan. In both cases, the angle of the sampling is determined by combination (ratio) of the gradient magnetic fields G1 and G2, and by changing this ratio, the radial sampling is enabled.

Figure 12:
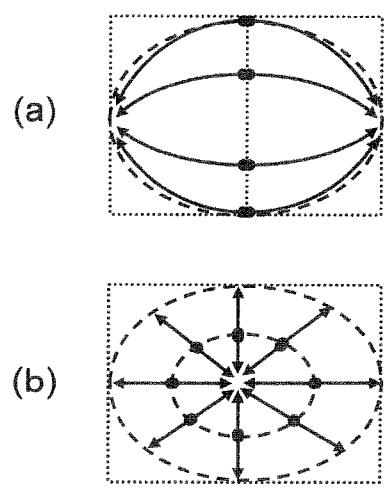
FIGS. 12, (a) and (b) show other examples of the circular sampling.

Further, there has been explained examples where, in the case of the circular sampling shown in FIG. 7, data on one circular arc are collected as one echo train, and in the case of the circular sampling shown in FIG. 11, data on one radius are collected as one echo train. However, as shown in FIGS. 12, (a) and (b), a number of data on one circular arc or on one radius may be obtained as a plurality of echo trains.

Hereafter, embodiments based on the first embodiment mentioned above aiming at further improvement in image quality will be explained.

Second Embodiment

In the MRI apparatus of this embodiment, the measurement controller comprises a calculation part for calculating delay time from a gating signal and signal acquisition time, and the calculation part updates the delay time and the signal acquisition time on the basis of body motion information of a subject under imaging, and controls the circular or elliptical sampling according to the updated delay time and signal acquisition time. The measurement controller reduces or increases the echo train number according to, for example, increase or decrease of the signal acquisition time after the updating compared with the same before the updating.

That is, this embodiment is characterized in that the delay time DT and data acquisition time AT for the gated imaging are changed according to change of the heart rate of the subject under imaging. Although the configuration of the apparatus of this embodiment is basically the same as that shown in FIG. 1, it is different that the operation processing part 114 has a function of inputting heart rate of the subject under imaging from the body motion information processing part 117, and correspondingly recalculating the systolic phase QT, diastolic phase TQ, delay time DT, and data acquisition time AT during the imaging, and a function of monitoring filling factor of the memory (k-space), and the measurement controller 111 has a function of controlling the pulse sequence on the basis of the recalculated delay time DT and data acquisition time AT.

Figure 13:
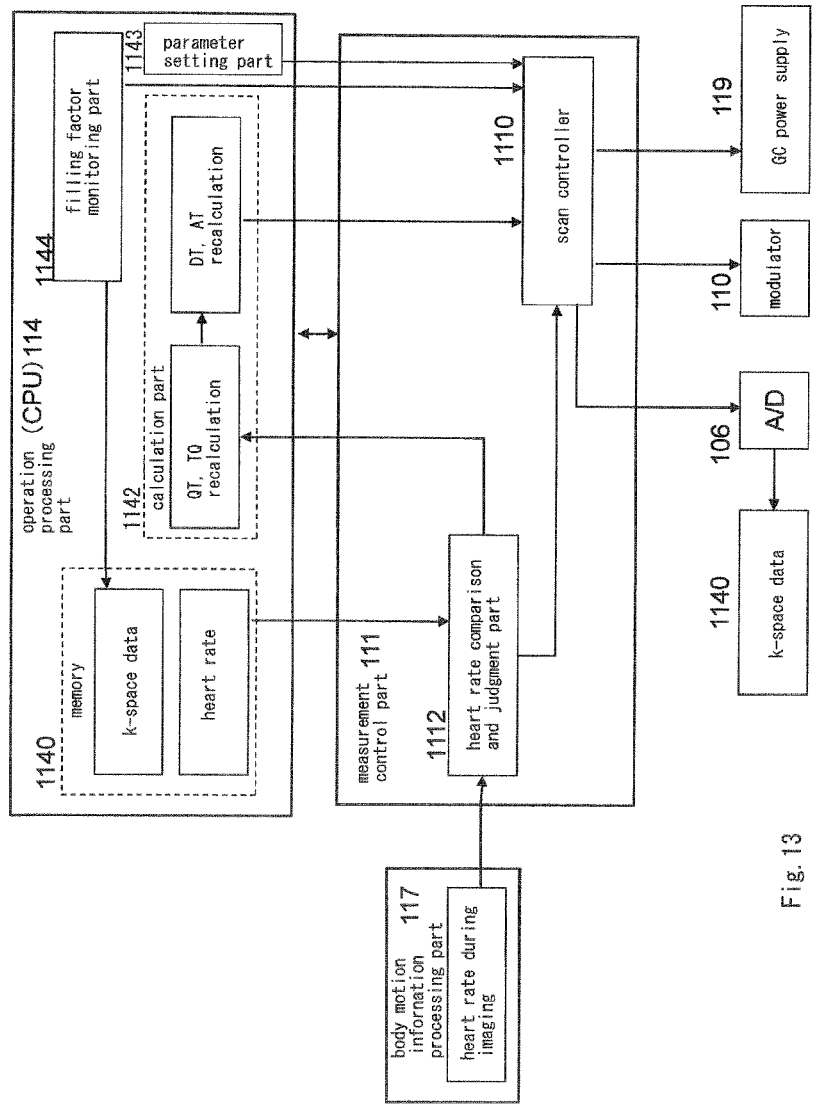
FIG. 13 is a block diagram showing important parts of the MRI apparatus according to the second embodiment.

The details of the operation processing part 114 and the measurement controller 111 for realizing the aforementioned functions are shown in FIG. 13. As shown in the diagram, the measurement controller 111 comprises a scan control part 1110 for controlling pulse sequence to be executed in imaging, and a heart rate comparison and judgment part 1112 for inputting heart rate (or R-R interval Trr) of the subject under imaging from the body motion information processing part 117, comparing it with a heart rate preliminarily set in the operation processing part 114, and sending body motion information (R wave of electrocardiogram) inputted from the body motion information processing part 117 to the scan control part 1110. Further, the operation processing part 114 comprises a parameter setting part 1143 for setting parameters of the pulse sequence, a memory 1140 for storing k-space data, imaging parameters, etc., a calculation part 1142 for recalculating the systolic phase QT and the diastolic phase TQ by using a newly inputted heart rate when it is judged that such recalculation is necessary on the basis of the result of the judgment performed by the heart rate comparison and judgment part 1112 of the measurement controller 111, and recalculating the delay time DT and the data acquisition time AT using the recalculated systolic phase QT and diastolic phase TQ, and a monitoring part 1144 for monitoring filling factor of the data filled in the k-space of the memory 1140.

Figure 14:
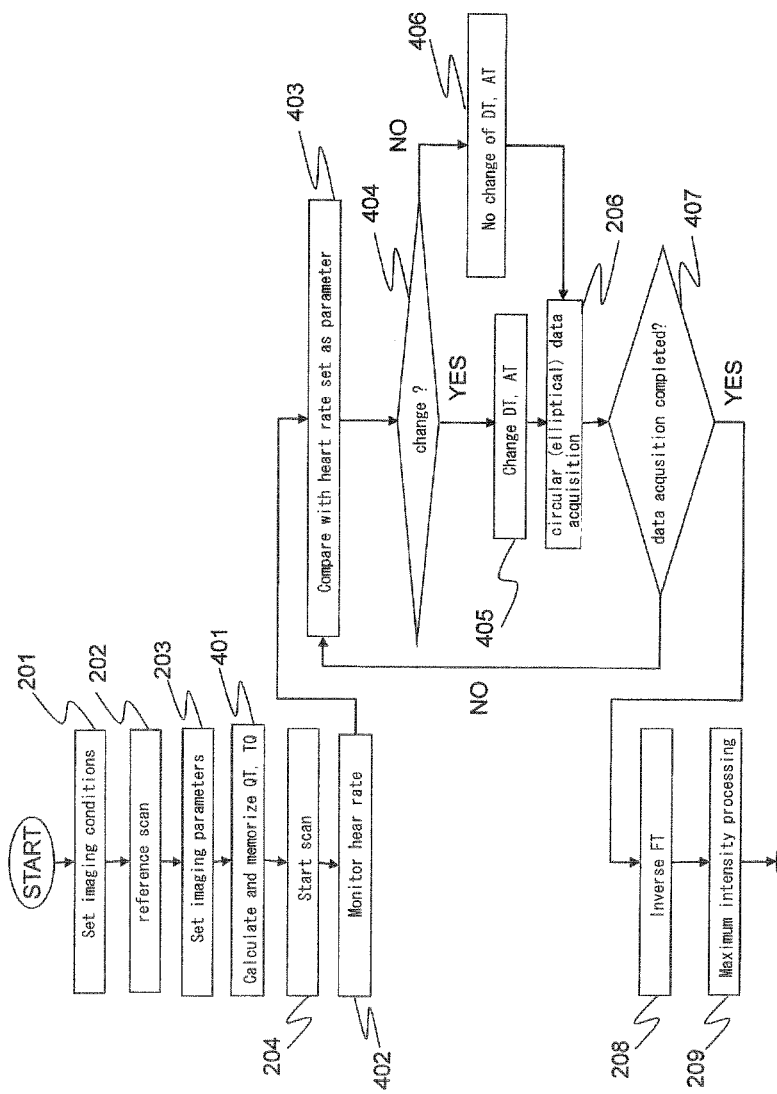
FIG. 14 shows a process flow of angiography according to the second embodiment.

Hereafter, the processing of the angiography according to this embodiment utilizing the aforementioned configuration will be explained. The process flow is shown in FIG. 14. In Steps 201 to 204, 206, 208 and 209 shown in FIG. 14, which are indicated with the same numerals as those of the process flow shown in FIG. 2, there are performed the same processings as those of the steps shown in FIG. 2 with the same numerals, respectively. The steps of the processings different from those of the process flow shown in FIG. 2 will be mainly explained below.

Also in this embodiment, reference scan and cine imaging of high resolution are performed with setting the imaging conditions to obtain imaging parameters (DT of the systolic and diastolic phases, data acquisition times AT, blood flow velocities), like the first embodiment (Steps 201 to 203). The initial values of these imaging parameters are stored in the memory. According to this embodiment, in Step 401, initial values of R-R interval Trr, systolic phase QT, and diastolic phase TQ, $Trr_0$, $QT_0$, and $TQ_0$, are further calculated, and these are memorized in the memory of the operation processing part 114.

For the calculation of the initial values, for example, the method described in Non-patent document 1 mentioned above is used. Specifically, average of interval of one R wave and the following R wave Trr, Trr,ave, is obtained, and used as $Trr_0$. Trr may be calculated from the heart rate initially set in Step 203, or may be calculated by using information sent from the body motion information processing part 117. The average is, for example, average of Trr obtained by measurement for five or more times of heartbeats. By using $Trr_0$, the initial values $TQ_0$ and $QT_0$ of the systolic and diastolic phases are calculated in accordance with the following equations (1) and (2).

[Equation 1]

$$QT_0 = k1 \times \log(10 \cdot (T_{rr0} + k2)) \tag{1}$$

$$TQ_0 = T_{rr0} - QT_0 \tag{2}$$

In the equation (1), k1 and k2 are empirically obtained coefficients. k1 varies depending on whether the subject is a healthy person or a cardiac patient, sex, and age, and in the case of a healthy person, a value of 0.375 to 0.390 is used depending on age and sex. Further, in the case of a cardiac patient, 0.410 is used for a female, and 0.405 is used for a male. k2 is 0.07.

Then, in Step 204, gated imaging (main imaging) is started by using an imaging sequence specifically set in Step 203, so that the imaging is gated with, for example, an electrocardiogram detected from the subject. The imaging sequence is such a pulse sequence for the circular sampling based on FSE as shown in FIG. 6.

During the imaging, in Step 402, the sensor part 116 for detecting body motion information of the subject monitors the heart rate of the subject under imaging, and the body motion information processing part 117 processes signals from the sensor part 116, and sends the processed body motion information to the measurement controller 111.

In Step 403, the measurement controller 111 (heart rate comparison and judgment part 1112) compares the monitored heart rate with the heart rate set as a parameter, and in Step 404, the measurement controller 111 judges presence or absence of change in the heart rate.

When it is judged that there is change of the heart rate in Step 404, the operation processing part 114 (calculation part 1142) recalculates the delay time DT and data acquisition time AT and changes them (Step 405). When it is judged that there is no change of the heart rate in Step 404, DT and AT are not changed (Step 406).

The recalculation of the delay time DT and data acquisition time AT performed by the calculation part 1142 will be explained. In the recalculation, Trr,ave is first obtained from average for five heartbeats by using the equations (3) and (4). The five heartbeats used for the average may be the latest five heartbeats, or may be arbitrarily determined by users. In the calculation of Trr,ave, Trr,ave may be calculated with weighting with respect to the measurement time. For example, a larger weight is imparted to data obtained at a closer measurement time.

$$T_{rr,ave}(i) = \frac{1}{i}\sum_{m=1}^{i} T_{rr,m} \quad (3)$$

for
$1 \le i < 5$ $$T_{rr,ave}(i) = \frac{1}{5}\sum_{m=i-4}^{i} T_{rr,m} \quad (4)$$

for
$5 \le i \le n$

By using the calculated average Trr,ave, QT(i) and TQ(i) at that time point are calculated in accordance with equations similar to the equations (1) and (2) mentioned above.
[Equation 3]

$$QT(i) = k1 \times \log(10 \cdot (T_{rr,ave} + k2)) \quad (1)$$

$$TQ(i) = T_{rr,ave} - QT(i) \quad (2)$$

A new DT(i) is calculated in accordance with the following equation (5) by using these QT(i) and TQ(i) as well as the initial values $Trr_0$, $QT_0$, and $TQ_0$ memorized in the memory. Further, the data acquisition time AT is calculated in accordance with the equation (6) with the ratio of $TQ_0$ obtained from the heart rate set as a parameter and TQ(i) obtained from the changed heart rate at the time of the main imaging.
[Equation 4]

$$DT_d(i) = \{(DT_{d0} - QT_0) \cdot TQ(i)/TQ_0\} + QT(i) \quad (5)$$

$$AT_d(i) = AT_{d0} \times TQ_0/TQ(i) \quad (6)$$

In the equation (5), $DT_d$ is the delay time for the diastolic phase, and $DT_{d0}$ is delay time for the diastolic phase set as a parameter. In the equation (6), $AT_d$ is the data acquisition time for the diastolic phase, and $AT_{d0}$ is the data acquisition time for the diastolic phase set as a parameter.

It is generally known that the length of the systolic phase QT does not so change even when the heart rate changes (Non-patent document 2). Therefore, it is not necessary to change the delay time DTs and the data acquisition time ATs set for the systolic phase at the time of the setting of parameters, and the equations (5) and (6) are for obtaining values recalculated for the diastolic phase. The calculation methods for $DT_s$, $AT_s$, $DT_d$, and $AT_d$ mentioned above are mere examples.

When it is judged that there is no change of the heart rate in Step 404, imaging based on the circular sampling is continued by using the delay time DT and data acquisition time AT set at the time of the first setting until all the data of a planned amount are obtained (Steps 206 and 407). Otherwise, when it is judged that there is change of the heart rate in Step 404, the delay time DT and the data acquisition time AT are recalculated, and then imaging based on the circular sampling is continued by using the delay time DT and data acquisition time AT recalculated by the operation processing part 114 (cardiac cycle information calculation part 1142) until all the data of a planned amount are obtained (Steps 206 and 407). During the measurement for the imaging, the body motion information processing part 117 continues monitoring of the heart rate of Step 402, and whenever it is judged that there is change of the heart rate, the operation processing part 114 (cardiac cycle information calculation part 1142) performs recalculation of the delay time DT and data acquisition time AT, and updates the values of them. The judgment for change of the heart rate by the heart rate comparison and judgment part 1112 (Step 404) may be performed for every one TR, or every two or more TRs.

Figure 15:
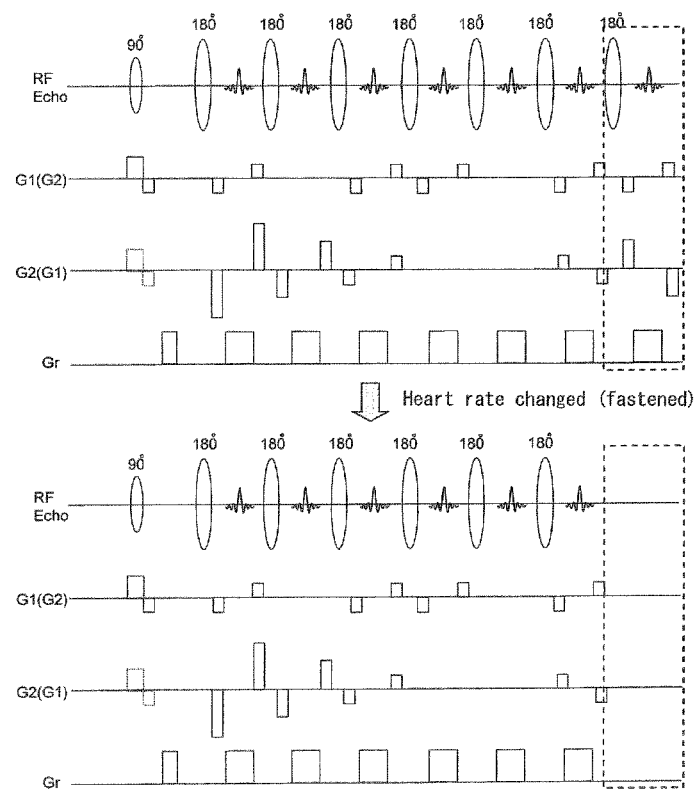

When data acquisition time AT is increased or decreased in Step 405, the echo train number is also increased or decreased in a corresponding manner. FIG. 15 includes drawings for explaining change of the echo train number in connection with shortening (prolongation) of AT. In the drawings, the parts enclosed with broken lines are the parts to be changed and changed. FIG. 15 shows an example of the case where the imaging sequence is a fast spin echo (FSE) type imaging sequence, as FIG. 6, and in the case of such a sequence of multi echo type, it is necessary to perform data acquisition so that effective TE should not change, and therefore data acquisition is repeated for the number of times determined at the time of the setting of the parameters. Accordingly, by not obtaining data for the high frequency region, AT is shortened so that the effective TE should not change. FIG. 15 shows an example where the echo train number set at the time of the setting of the parameters is 7, and AT is shortened by reducing the echo train number to 6 according to the change of the heart rate. When AT is prolonged, the echo train number may be increased, so that the data of the high frequency region can be obtained, which cannot be obtained at the time of shortening AT.

Completion of the data acquisition is judged in Step 407 while monitoring the filling factor of the k-space. Therefore, the filling factor monitoring part 1144 of the operation processing part 114 monitors the filling factor of the k-space and determines unmeasured data by, for example, comparing number of data on the table for controlling application of gradient magnetic fields in the circular sampling (FIG. 10) with number of the actually measured data. Data of the high frequency region not obtained are obtained when AT is prolonged, and when the filling factor of the k-space reaches 100%, the imaging is ended. Alternatively, the imaging is ended when the filling factor of the k-space reaches a predetermined rate, and an estimation processing may be performed for data of the high frequency region not obtained at that time point. Then, the image reconstruction processing and the projection processing are performed in Steps 208 and 209 as in the first embodiment.

Figure 16:
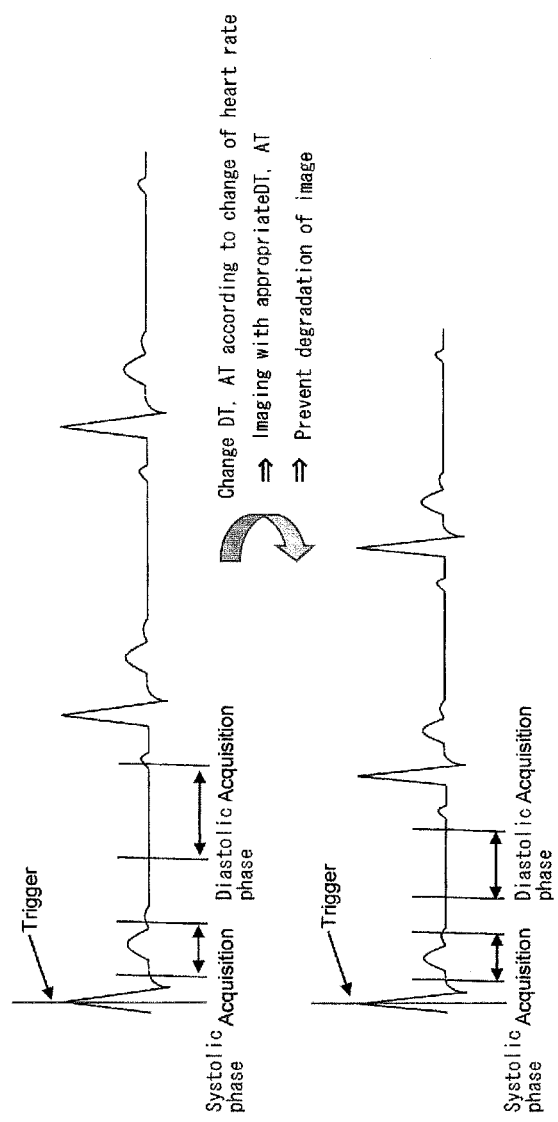
FIG. 16 shows gated imaging in which DT and AT are changed on real time basis.

According to this embodiment, by changing DT and AT of the systolic and diastolic phases during the imaging, the imaging can be always performed with appropriate cardiac time phase and data acquisition time as shown in FIG. 16, and therefore degradation of image quality and prolongation of imaging time can be prevented.

Third Embodiment

The MRI apparatus of this embodiment comprises a parameter setting part for setting parameters of the imaging sequence, and the measurement controller controls sampling trajectory of the circular or elliptical sampling according to parameters set by the parameter setting part to minimize change of signal intensity between data adjacent to each other in the sampling direction. For example, the measurement controller divides a circular or elliptical region for the sampling into a plurality of regions, and in the sampling of adjacent two regions, the measurement controller controls the sampling trajectory so that data of the two regions closest to the boundary of them are both starting positions of the sampling or ending positions of the sampling.

Further, in the MRI apparatus of this embodiment, for example, the measurement controller divides the circular or elliptical region for sampling according to effective echo time (TE), so that the echo of that effective TE is arranged in the low frequency region of the k-space.

That is, this embodiment is the same as the first and second embodiments in that non-contrast gated angiography is performed by circular sampling, and after a predetermined delay time DT, an imaging sequence for the circular sampling is executed with a trigger of a gating signal to perform data collection within a predetermined data acquisition time AT. However, this embodiment is characterized in that the measurement order in the circular sampling is controlled sot that gap of signal intensities of k-space data, which may be produced due to echo shift, is reduced as much as possible.

Before explanation of this embodiment, echo shift and gap of signal intensity of k-space data induced by echo shift will be first explained with reference to FIGS. 17 and 18. In these figures, the drawings of (a) show data collection directions in planes perpendicular to the kx direction of the 3D k-space (sampling trajectory), and the drawings of (b) show the same plane of the k-space as that of (a), in which the circle inscribed in the matrix of the k-space indicates an approximate region for the circular sampling, and the arrows indicate data acquisition orders for echo trains. The drawings of (c) show signal Intensities, FIGS. 17 and 18 show simplified examples in which, as imaging parameters, IET is 5 ms, and echo train number is 7.

In a pulse sequence of the multi echo type, the order of the measurement in the k-space is decided so that the time of measuring the low frequency region data of the k-space corresponds to the effective TE. For example, as shown in FIG. 17, when the effective TE is 20 ms, and the imaging parameters are those shown above, by successively measuring echoes from a region of one end to a region of the other end in one of the divided regions of the k-space in a number equal to <echo train number−1>, low frequency region data are obtained at the effective TE. When the effective TE is 35 ms as shown in FIG. 18, by shifting the starting position of echo train to start the sampling from a position in the middle of the k-space, low frequency region data are obtained at the effective TE without wasting echoes obtained up to the effective TE. In FIG. 18, (b), the measurement is performed from the boundary of the 4th and 5th regions from the left end (indicated with a thick line) towards the right end, and further continued from the left end towards the right end side (sampling trajectories start from black circles as starting points as shown in FIG. 18, (a)). To shift the echoes at the start of the data acquisition according to the effective TE so that echoes at the effective TE are arranged in a low frequency region of the k-space as described above is called echo shift.

Figure 17:
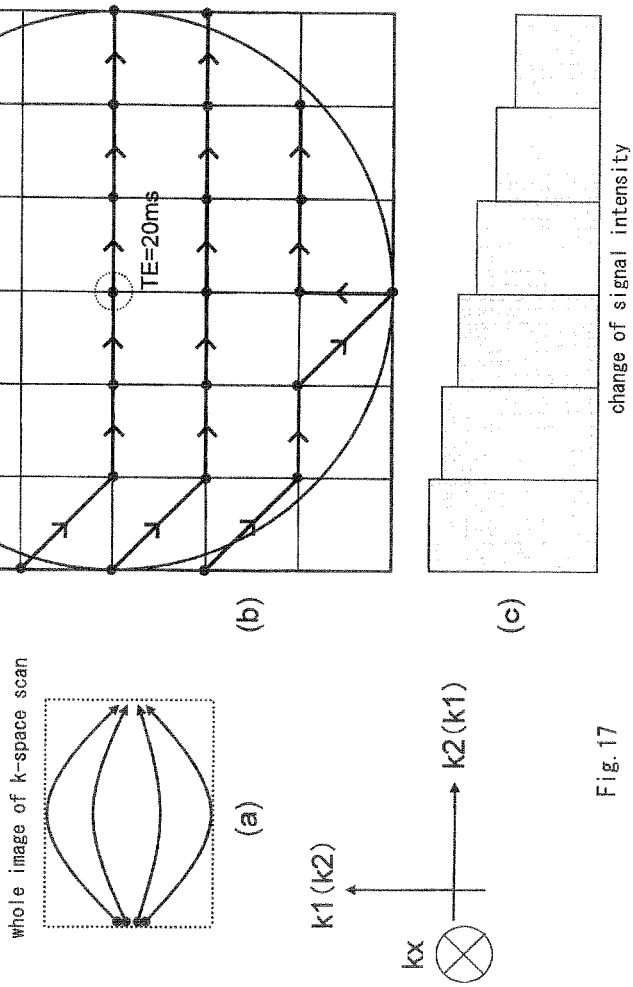
FIG. 17 is a drawing for explaining echo shift, which shows a no echo shift case.
Figure 18:
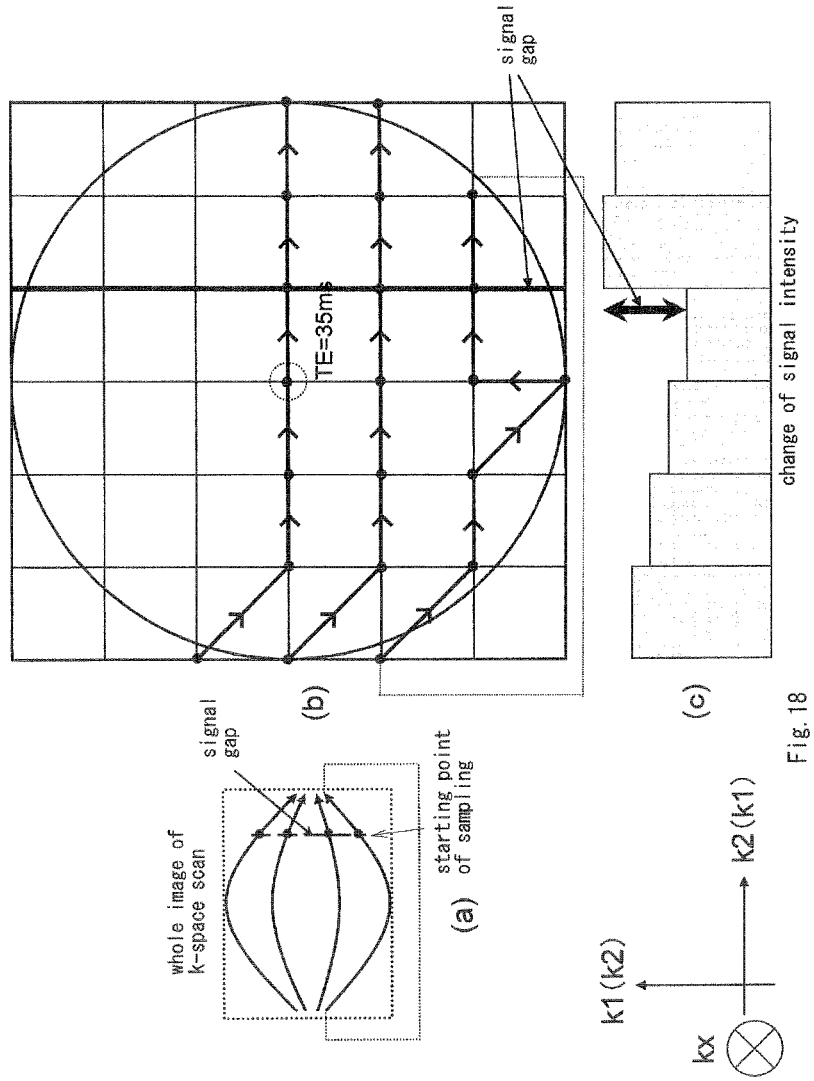
FIG. 18 is a drawing for explaining echo shift, which shows a case where a signal intensity gap is generated by echo shift.

In the above measurement, signal intensity of the first echo of the echo train is the highest, and signal intensity gradually decreases due to the T2 decay as shown in of FIG. 17, (c) and FIG. 18, (c). When the echo shift is not employed (FIG. 17), gap of signal intensity is not generated in the k-space, but when the echo shift is employed (FIG. 18), gap of signal intensity is generated between the first echo and the last echo of the echo train. An image reconstructed in a state that such a gap of signal intensity is generated contains artifacts.

Figure 19:
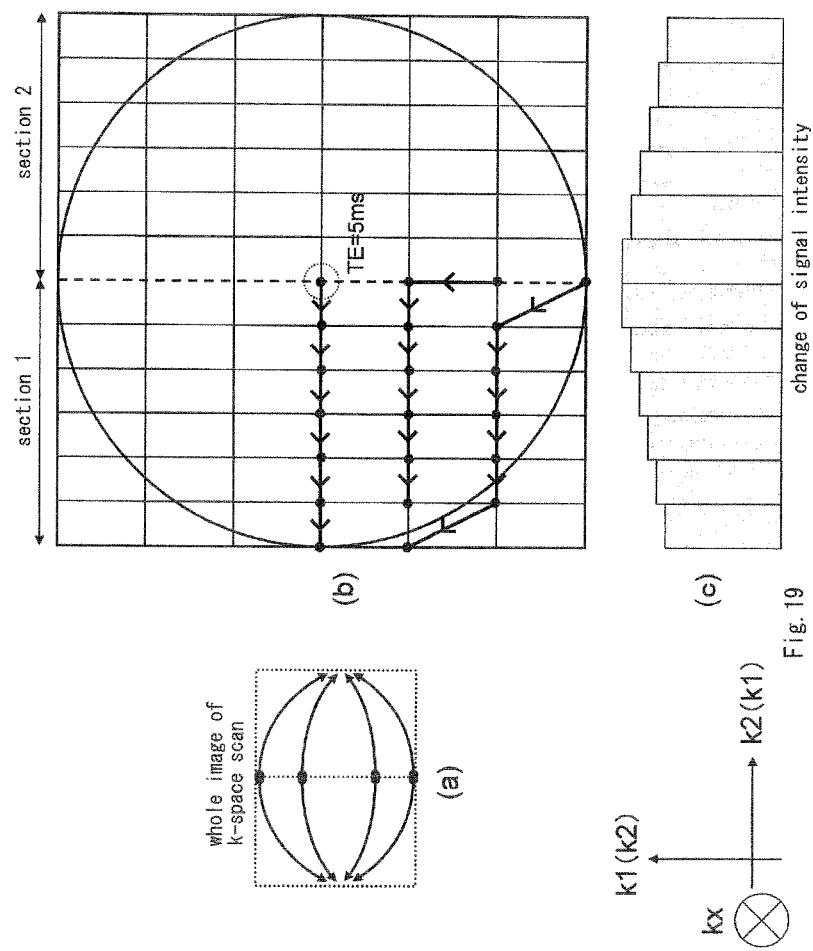
FIG. 19 is a drawing for explaining echo shift, which shows a no echo shift case.
Figure 20:
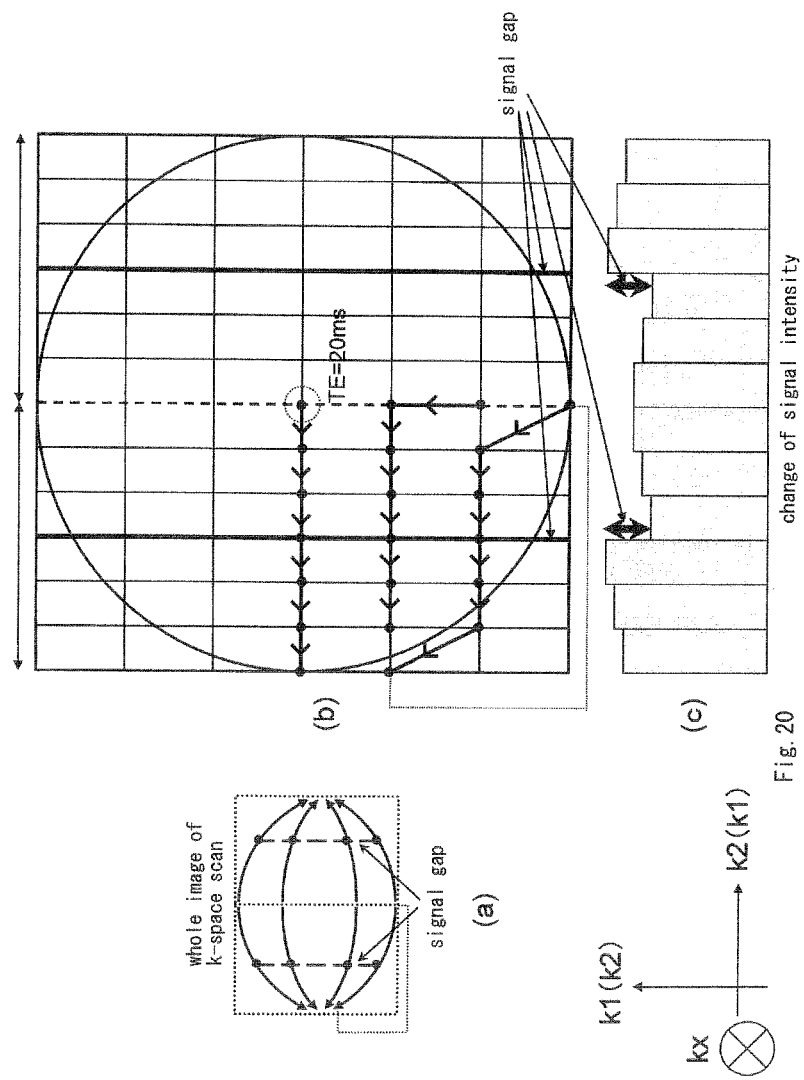
FIG. 20 is a drawing for explaining echo shift, which shows a case where signal intensity gaps are generated by echo shift.

FIGS. 19 and 20 show examples where the data measurement is performed by dividing the k-space into two sections (sections 1 and 2), and dividing each section into regions in a number corresponding to the echo train number. FIGS. 19 and 20, (a) to (c) are drawings similar to those of FIGS. 18, (a) to (c), respectively. When the effective TE is 5 ms, and echo shift is not employed (FIG. 19), in the data collection for each section, data not including gap of signal intensity can be obtained by obtaining low frequency region data as the first echo of the echo train, and then successively obtaining data of the high frequency region side. In the case shown in FIG. 20, the effective TE is 20 ms, and echo shift is employed. Therefore, there is used a data collection order with which the data acquisition is started from a middle position (position shown with a thick line) in each section, and finally completed at the middle position. As a result, at the middle position of each section, a gap of signal intensity between the first echo and the final echo of echo train is generated.

Figure 21:
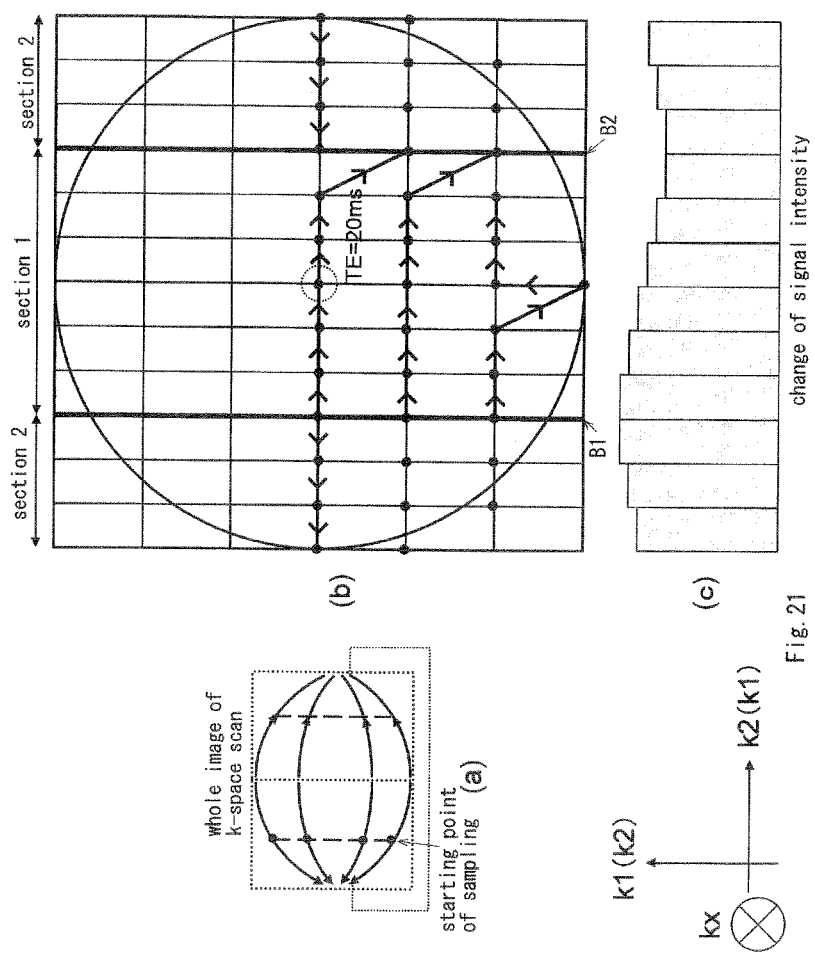
FIG. 21 shows sampling trajectory for eliminating the gaps of signal intensity shown in FIG. 20 according to the third embodiment.

According to this embodiment, by dividing the k-space in a different manner, and controlling the data collection order in the section, gap of signal intensity generated in the case of employing echo shift is eliminated. An example of such a case is shown in FIG. 21, which corresponds to the example shown in FIG. 20. The drawings of FIG. 21, (a) to (c) are similar to those of FIG. 18, respectively. According to this embodiment, the k-space is not divided at the center, but it is divided into the section 1 of low frequency region data, of which center corresponds to the origin of the k-space, and the section 2 outside the section 1. In the data collection in the sections 1 and 2, data are collected from one of the boundaries B1 and B2 of the two sections (for example, B1) towards the other boundary (for example, B2) in both sections. By starting the data collection from the positions of the two sections closest to the same boundary in the data collection of them as described above, generation of gap in signal intensity at the boundaries B1 and B2 can be avoided, as shown in FIG. 21, (c).

FIG. 21 shows an example where the k-space is divided into two sections, namely, data on one circular arc are collected by two shots. However, even when the k-space is divided into three or more sections, generation of gap of signal intensity can be avoided by controlling the data collection order so that the start and end positions of the data collection are the same for the section on both sides of each boundary.

The process flow of the imaging in this embodiment is basically the same as that of the first or second embodiment. However, according to this embodiment, after the signal acquisition time AT, echo train number, IET, and effective TE are determined in Step 201 shown in FIG. 2 or 14, number of shots for obtaining data on one circular arc in the circular sampling is determined, and whether the echo shift is required or not is judged. The k-space is divided into sections according to the determined number of shots, and data collection order is determined so that gap of signal intensity is not generated at boundaries of the sections.

Also in this case, as shown in the process flow of FIG. 14, it is possible to monitor the heart rate and recalculate the delay time DT and data acquisition time AT according to the monitored heart rate. For example, in the example shown in FIG. 21, when the echo train number is decreased from 7 to 6 due to shortening of AT, the last (7th) echo is not measured in the section 1, but in the section 2, the data maximally on the high frequency region side (originally the 3rd and 4th echoes) are not measured, and the data not measured in the section 1 (data at the boundary of the sections 1 and 2) are measured as the 6th echo. This makes possible to decrease the echo train number with eliminating the gap of signal intensity. The high frequency region data not measured are measured or estimated in the same manner as that of the second embodiment when AT is prolonged.

According to this embodiment, when the echo shift is employed, generation of such a gap of signal intensity as mentioned above can be avoided by controlling the echo train number, and controlling the signal acquisition order.

The embodiments described above are explained for the circular sampling in which a circular region of the k-space is scanned along circular arcs as an example. However, they can also be similarly applied to such radial sampling as shown in FIGS. 11, (*a*) and (*b*). A specific example of elimination of the gap at the time of employing the echo shift in the radial sampling will be explained with reference to FIGS. 22, (*a*) and (*b*).

Figure 22:
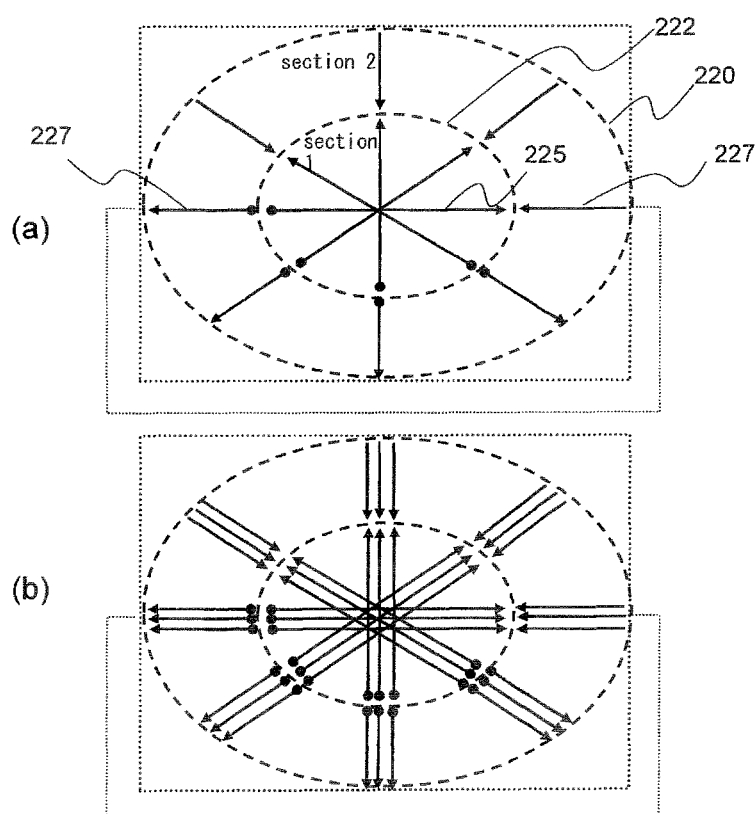
FIG. 22 includes drawings showing modified examples of the circular sampling according to the third embodiment.

FIG. 22, (*a*) shows an example of the radial sampling (radial scan) similar to that shown in FIG. 11, (*a*). However, in this example, a boundary 222 of sections is set on a concentric circle inside a circle 220 inscribed in the k-space, and the k-space is divided into a section 1 inside the boundary, and a section 2 outside the boundary. One sampling pathway (spoke) corresponding to the diameter of the circle 220 is thereby divided into a pathway 225 passing the section 1, and a pathway 227 passing the section 2, and data on each pathway are collected with one shot of echo train. Data collection of the data on the pathway 225 passing the section 1 is started from a point on the boundary 222 or a point nearest to the boundary 222, and completed at an opposingly locating point on the boundary or nearest to the boundary. Data collection of the data on the pathway 227 passing the section 2 is started from a point adjacent to the point from which the data collection of the section 1 is started, and performed towards the high frequency region side. Then, the data collection is continued from the corresponding high frequency region side, and completed at a point adjacent to the point at which the data collection of the section 1 is ended. Data are collected with such a sampling trajectory for all the pathways (spokes), and all the data for the region surrounded by the circle 220 are finally collected.

By dividing the k-space and controlling the data collection order (sampling trajectory) as described above, the gap of signal intensity at the boundary can be eliminated, and artifacts generated by the gap can be suppressed.

FIG. 22, (*b*) shows an example of the radial sampling similar to that of FIG. 11, (*b*) (hybrid radial scan). However, in this example, the k-space is divided into two sections with a circular boundary, and data collection order is controlled so that adjacent two data points on both sides of the boundary are both starting points or end points of the data collection, as in the radial scan shown in FIG. 22, (*a*). The some effect as that of the example shown in FIG. 22, (*a*) can be thereby obtained.

Also in these radial samplings, it is possible to monitor the heart rate during imaging, and adjust the delay time DT and data acquisition time AT according to the monitored heart rate, like the second embodiment. The method therefor is the same as that explained for the circular sampling shown in FIG. 21. When AT is shortened, data of the high frequency region are not measured, and when AT is prolonged, data of high frequency region not measured are collected.

Although the gap of signal intensity in the k-space can be decreased by using this embodiment, the influence of the T2 decay itself cannot be eliminated. Therefore, it is preferable to perform T2 correction in Step 208 as required, and then perform image reconstruction.

Fourth Embodiment

In the MRI apparatus of this embodiment, the imaging sequence includes application of gradient magnetic fields for dephasing or rephrasing for the perpendicular three directions.

Figure 23:
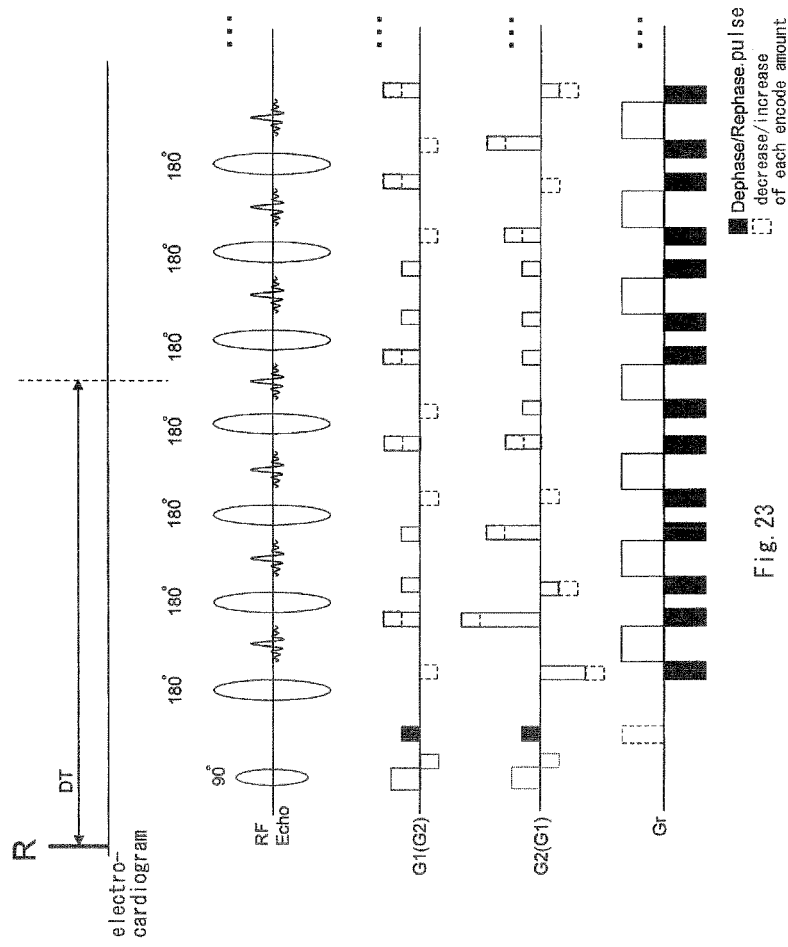
FIG. 23 shows an imaging pulse sequence according to the fourth embodiment.

That is, this embodiment is a further improved version of the first to third embodiments mentioned above, and is characterized in that dephase or rephase pulses are applied for all the directions of H-F, R-L, and A-P including the readout direction. A pulse sequence for this characteristic is shown in FIG. 23. In the diagram, the black rectangles indicate dephase or rephase pulses. Further, the boxes formed with broken lines indicate increase or decrease of encoding amount.

According to this embodiment, depiction ability for blood vessels running in a direction other than the readout direction can also be improved by applying the dephase or rephase pulses in all the directions. The characteristics of this embodiment can be applied to all of the first to third embodiments mentioned above.

Some characteristics of the embodiments described above are summarized as follows.

The measurement controller (111) controls sampling trajectory and/or sampling number in the circular or elliptical sampling according to delay time from a gating signal and signal acquisition time.

The measurement controller (111) comprises the calculation part (1141, 1142) for calculating delay time and signal acquisition time, and the calculation part updates the delay time and signal acquisition time on the basis of body motion information of a subject under imaging, and controls the circular or elliptical sampling according to the updated delay time and signal acquisition time.

The measurement controller (111) increases or decreases the echo train number according to increase or decrease of the signal acquisition time after the update compared with that before the update.

The measurement controller (111) divides the circular or elliptical sampling region into regions each corresponding to each echo number, and virtually randomizes arrangement positions of echoes of the same echo number obtained with a plurality of shots.

The measurement controller (111) determines the starting position of the circular or elliptical sampling so that echo of the effective echo time (TE) is arranged in the low frequency region of the k-space according to the effective echo time (TE).

The parameter setting part (1143) for setting parameters of the pulse sequence is provided, and the measurement controller (111) controls sampling trajectory of the circular or elliptical sampling according to the parameters set by the parameter setting part (1143) to minimize signal intensity change between data adjacent to each other in the sampling direction. For example, a sampling region of a circular or elliptical shape is divided into a plurality of sections, and in the sampling of two adjacent sections, sampling trajectories are controlled so that the data positions nearest to the boundary of the two sections both serves as starting positions or end positions of the sampling. Further, for example, a sampling region of a circular or elliptical shape is divided into at least a first section including the center of the k-space and regions on both sides thereof, and a second section including the region not included in the first section.

The readout direction is a running direction of a blood vessel of the subject.

The parameter setting part for setting the parameters of the imaging sequence sets imaging parameters by using echoes or image measured in a reference scan.

The parameter setting part for setting the parameters of the imaging sequence sets the repetition time (TR) of the imaging sequence so that it corresponds to a plurality of times of the cardiac cycle of the subject.

The imaging sequence includes application of a gradient magnetic field for dephasing or rephasing for modulating phase of nuclear magnetization mainly for blood flow.

The imaging sequence includes application of gradient magnetic fields for dephasing or rephasing for orthogonal three directions.

The imaging sequence is a multi echo type sequence for successively obtaining a plurality of echo signals after one time of excitation of magnetization. For example, the multi echo type sequence is a fast spin echo type sequence.

In the circular or elliptical sampling, a k-space region surrounded by a circle or an ellipse is sampled in the shape of a circular arc from one end towards the other end thereof in a first direction perpendicular to the readout direction. Alternatively, in the circular or elliptical sampling, a k-space region surrounded by a circle or an ellipse is radially sampled from the center towards a peripheral position of the circle or ellipse.

INDUSTRIAL APPLICABILITY

According to the present invention, in 3D non-contrast MRA, degradation of image quality induced by various causes can be prevented, and an MRA image of favorable image quality useful for diagnosis can be provided. Specifically, influence of the T2 decay for a specific encoding axis direction can be avoided as much as possible to obtain a good image with less fading. Further, degradation of image quality due to change of heart rate during imaging can be prevented. Furthermore, generation of gap in signal intensity to be generated at the time of employing echo shift can be prevented, and image quality can be thereby improved.

DESCRIPTION OF NUMERICAL NOTATIONS

102 . . . Static magnetic field generation magnet, 103 . . . gradient magnetic field coil, 104 . . . transmission RF coil, 105 . . . reception RF coil, 106 . . . signal detection part, 107 . . . signal processing part, 108 . . . main controller, 110 . . . RE transmission part, 111 . . . measurement controller, 114 . . . operation processing part, 117 . . . body motion information processing part, 1110 . . . scan control part, 1112 . . . heart rate comparison and judgment part, 1140 . . . memory, 1142 . . . calculation part, 1143 . . . parameter setting part, 1144 . . . filling factor monitoring part

What is claimed is:

1. A magnetic resonance imaging apparatus comprising:
an imaging part comprising a static magnetic field generation part, a gradient magnetic field generation part, a radio frequency magnetic field generation part, and a magnetic resonance signal reception part, and
a measurement controller for controlling operations of the imaging part according to an imaging sequence, wherein:
the imaging sequence includes an angiography sequence for performing circular or elliptical sampling of a plane perpendicular to the readout direction of the three-dimensional k-space,
the measurement controller controls the imaging sequence by using a grating signal based on body motion information of a subject, and controls the circular or elliptical sampling according to delay time from the gating signal and signal acquisition time, and
the imaging sequence includes application of gradient magnetic fields for dephasing or rephasing for modulating phase of nuclear magnetization mainly for blood flow for orthogonal three directions.

2. The magnetic resonance imaging apparatus according to claim 1, wherein:
the measurement controller controls sampling trajectory and/or sampling number in the circular or elliptical sampling according to the delay time from the gating signal and signal acquisition time.

3. The magnetic resonance imaging apparatus according to claim 1, wherein:
the measurement controller comprises a calculation part for calculating the delay time and signal acquisition time, and the calculation part updates the delay time and signal acquisition time on the basis of body motion information of the subject under imaging, and
controls the circular or elliptical sampling according to the updated delay time and signal acquisition time.

4. The magnetic resonance imaging apparatus according to claim 3, wherein:
the measurement controller increases or decreases echo train number according to increase or decrease of the signal acquisition time after the update compared with that before the update.

5. The magnetic resonance imaging apparatus according to claim 1, wherein:
the measurement controller divides the circular or elliptical sampling region into regions each corresponding to each echo number, and virtually randomizes positions where echoes of the same echo number are arranged for each shot.

6. The magnetic resonance imaging apparatus according to claim 1, wherein:
a parameter setting part for setting parameters of the imaging sequence is provided, and
the measurement controller controls sampling trajectory of the circular or elliptical sampling according to the parameters set by the parameter setting part to minimize signal intensity change between data adjacent to each other in the sampling direction.

7. The magnetic resonance imaging apparatus according to claim 6, wherein:
the measurement controller divides the sampling region of a circular or elliptical shape into a plurality of sections, and in the sampling of two adjacent sections, controls sampling trajectories so that the data positions nearest to the boundary of the two sections both serves as starting positions of the sampling or end positions of the sampling.

8. The magnetic resonance imaging apparatus according to claim 7, wherein:
the measurement controller divides the sampling region of a circular or elliptical shape into at least a first section including the center of the k-space and regions on both sides thereof, and a second section including the region not included in the first section.

9. The magnetic resonance imaging apparatus according to claim 6, wherein:
the measurement controller divides the sampling region of a circular or elliptical shape into sections according to an effective echo time (TE) so that echo of the effective echo time (TE) is arranged in the low frequency region of the k-space.

10. The magnetic resonance imaging apparatus according to claim 1, wherein:
the readout direction is a running direction of a blood vessel of the subject.

11. The magnetic resonance imaging apparatus according to claim 1, wherein:
a parameter setting part for setting the parameters of the imaging sequence is provided, and
the parameter setting part sets imaging parameters by using echoes or image measured in a reference scan.

12. The magnetic resonance imaging apparatus according to claim 1, wherein:
a parameter setting part for setting the parameters of the imaging sequence is provided, and
the parameter setting part sets the repetition time (TR) of the imaging sequence to a plurality of times of the cardiac cycle of the subject.

13. The magnetic resonance imaging apparatus according to claim 1, wherein:
the imaging sequence is a multi echo type sequence for successively obtaining a plurality of echo signals after one time of excitation of magnetization.

14. The magnetic resonance imaging apparatus according to claim 13, wherein:
the multi echo type sequence is a fast spin echo type sequence.

15. The magnetic resonance imaging apparatus according to claim 1, wherein:
in the circular or elliptical sampling, a k-space region surrounded by a circle or an ellipse is radically sampled from the center towards a peripheral position of the circle or ellipse.

16. A magnetic resonance imaging apparatus comprising:
an imaging part comprising a static magnetic field generation part, a gradient magnetic field generation part, a radio frequency magnetic field generation part, and a magnetic resonance signal reception part, and
a measurement controller for controlling operations of the imaging part according to an imaging sequence, wherein:
the imaging sequence includes an angiography sequence for performing circular or elliptical sampling of a plane perpendicular to the readout direction of the three-dimensional k-space,
the measurement controller controls the imaging sequence by using a grating signal based on body motion information of a subject, and controls the circular or elliptical sampling according to delay time from the gating signal and signal acquisition time, and
in the circular or elliptical sampling, a k-space region surrounded by a circle or an ellipse is sampled in the shape of a circular arc from one end towards the other end thereof in a first direction perpendicular to the readout direction.

17. A method for angiography using a magnetic resonance imaging apparatus, which comprises:
executing an angiography sequence for performing sampling within a circular or elliptical shape in a plane perpendicular to the readout direction of the three-dimensional k-space as an imaging sequence, the angiography sequence including application of gradient magnetic fields for dephasing or rephrasing for modulating phase of nuclear magnetization mainly for blood flow for orthogonal three directions and,
at the time of executing the angiography sequence, controlling the circular or elliptical sampling by using a gating signal based on body motion information of a subject according to delay time from the gating signal and signal acquisition time.

18. The method for angiography according to claim 17, wherein:
sampling trajectory and/or sampling number is controlled according to the delay time from the gating signal and signal acquisition time in the sampling within a circular or elliptical shape.

19. A method of angiography using a magnetic resonance imaging apparatus, which comprises:
executing an angiography sequence for performing sampling within a circular or elliptical shape in a plane perpendicular to the readout direction of the three-dimensional k-space as an imaging sequence,
at the time of executing the angiography sequence, controlling the circular or elliptical sampling by using a gating signal based on body motion information of a subject according to delay time from the gating signal and signal acquisition time, and
in the circular or elliptical sampling, sampling a k-space region surrounded by a circle or an ellipse in the shape of a circular arc from one end towards the other end thereof in a first direction perpendicular to the readout direction.

* * * * *